(12) United States Patent
Nakamura et al.

(10) Patent No.: US 7,049,043 B2
(45) Date of Patent: May 23, 2006

(54) PHOTOSENSITIVE COMPOSITION

(75) Inventors: Ippei Nakamura, Shizuoka-ken (JP);
Ikuo Kawauchi, Shizuoka-ken (JP);
Takeshi Serikawa, Shizuoka-ken (JP);
Mitsumasa Tsuchiya, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 266 days.

(21) Appl. No.: 10/446,145

(22) Filed: May 28, 2003

(65) Prior Publication Data
US 2004/0018444 A1    Jan. 29, 2004

(30) Foreign Application Priority Data
May 28, 2002    (JP)    ............................. 2002-154279

(51) Int. Cl.
*G03F 7/021*    (2006.01)
*G03F 7/30*    (2006.01)

(52) U.S. Cl. ...................... 430/157; 430/162; 430/176; 430/302

(58) Field of Classification Search ................ 430/157, 430/162, 176, 302
See application file for complete search history.

(56) References Cited

U.S. PATENT DOCUMENTS

| | | | |
|---|---|---|---|
| 5,840,467 A | 11/1998 | Kitatani et al. | |
| 6,238,838 B1 | 5/2001 | Gaschler et al. | |
| 6,423,467 B1 * | 7/2002 | Kawauchi et al. | 430/270.1 |
| 2003/0194653 A1 * | 10/2003 | Takamiya | 430/302 |
| 2003/0207203 A1 * | 11/2003 | Tsuchimura et al. | 430/270.1 |

FOREIGN PATENT DOCUMENTS

| | | |
|---|---|---|
| EP | 1 316 421 A2 | 6/2003 |
| JP | 10-282643 A | 10/1998 |
| JP | 2001-324803 A | 11/2001 |

OTHER PUBLICATIONS

Japanese Abstract No. 2001324808, dated Nov. 22, 2001.

* cited by examiner

*Primary Examiner*—John S. Chu
(74) *Attorney, Agent, or Firm*—Sughrue Mion, PLLC

(57) ABSTRACT

The invention provides a photosensitive composition including (A) a vinyl polymer containing a copolymerization component having a carboxyl group, having a content of the carboxyl group in a molecule of 2.0 meq/g or higher and having a solubility parameter less than 21.3 MPa$^{1/2}$, (B) a polymer compound including a phenolic hydroxyl group, and (C) an IR absorber.

20 Claims, No Drawings

PHOTOSENSITIVE COMPOSITION

BACKGROUND OF THE INVENTION

1. Field of the Invention

The present invention relates to a photosensitive composition showing an increased solubility in an alkaline aqueous solution by an exposure to an IR light. More particularly, the invention relates to a photosensitive composition suitable for use as an image recording layer of a positive-type planographic printing plate precursor, capable of so-called direct printing plate making. That is, the printing plate precursor can be directly converted to a printing plate by scanning with an IR laser in accordance with a digital signal outputted from a computer or the like.

2. Description of the Related Art

There have been used various photosensitive compositions for visible image formation or as a material for a planographic printing plate. Owing to recent remarkable advances in the laser technology for planographic printing, solid-state lasers and semiconductor lasers emitting a light in the near IR to IR region have become easily available with a high output and a compact size. Such lasers are extremely useful as an exposure light source when a printing plate is made directly in accordance with a digital data such as that outputted from a computer.

A positive-type planographic printing plate precursor for IR laser includes a binder resin soluble in an alkaline aqueous solution, an IR dye generating heat by absorption of light etc. as essential components. The IR dye etc. functions, in an unexposed area (image area), as a dissolution inhibitor that substantially reduces the solubility of the binder resin by an interaction with the binder resin. In contrast, in an exposed area (non-image area), the interaction of the IR dye etc. and the binder resin becomes weaker by the generated heat, and the binder resin dissolves in the alkaline developer, thereby a planographic printing plate is formed.

However, in such positive-type planographic printing plate precursor for IR laser, a difference of solubility to the developer between an unexposed area (image area) and an exposed area (non-image area) is still not sufficient under various conditions of use. Accordingly, an excessive development or a deficient development often occurs when the condition of use fluctuates.

Such drawback results from a fundamental difference in the printing plate making mechanism between the positive-type planographic printing plate precursor for IR laser and a positive-type planographic printing plate precursor for printing plate making by an exposure with UV. More specifically, the positive-type planographic printing plate precursor for printing plate making by an exposure with UV requires in addition to the binder resin soluble in an alkaline aqueous solution, an onium salt and a quinonediazide as essential components, which perform two functions of serving, in an unexposed area (image area), as a dissolution inhibitor by an interaction with the binder resin, and, in an exposed area (non-image area), being decomposed by light to generate an acid, thereby serving as a dissolution accelerator.

On the other hand, in the positive-type planographic printing plate precursor for IR laser, the IR dye etc. only functions as a dissolution inhibitor in an unexposed area (image area) and does not accelerate the dissolution of the exposed area (non-image area). It is associated with a drawback of often generating a residual film since, in the vicinity of an interface of an exposed area with a substrate, the generated heat tends to diffuse into the substrate and is not efficiently utilized for image formation.

For resolving such drawback, it is proposed to use a binder resin having a higher solubility to the alkaline developer or to add a compound, such as a melamine derivative, having an amino group and showing a higher reactivity. However, such methods makes a state prior to the development unstable, eventually leading to a lowered shelf-stability.

On the other hand, in order to increase a film strength, Japances Patent Application Laid-Open (JP-A) No. 10-282643 discloses an example in which polyacrylic acid is comprised in a positive-type photosensitive composition including a photothermal converting substance and an alkali-soluble resin. However, further improvement in the film strength is required in view of a further rise in the sensitivity of the photosensitive layer. Also JP-A No. 2001-324808 discloses an example in which a methyl methacrylate-(meth)acrylic acid copolymer is comprised in a positive-type photosensitive composition including a photothermal converting substance and a novolac resin. However, it is still insufficient in improving the film strength while maintaining the sensitivity.

SUMMARY OF THE INVENTION

In consideration of the circumstances described above, an object of the present invention is to provide a photosensitive composition which is useful as a image recording layer of a positive-type planographic printing plate precursor and which is excellent in a film forming property and a film strength, wherein an exposed portion of the positive-type planographic printing plate precursor to the IR, dissolves rapidly in an alkaline aqueous solution.

The present inventors, as a result of intensive investigations, have found that the above object of the invention can be achieved by a combined use of a vinyl polymer having specific conditions and a polymer compound having a phenolic hydroxyl group constituting an alkali-soluble resin.

The first aspect of the invention is a photosensitive composition (P) comprising:

(A) a vinyl polymer including a copolymerization component having a carboxyl group, the carboxyl group in a molecule in an amount of 2.0 meq/g or greater, and the vinyl polymer having a solubility parameter less than 21.3 MPa$^{1/2}$;

(B) a polymer compound having a phenolic hydroxyl group; and (C) an IR absorber.

The second aspect of the invention is the photosensitive composition (P), wherein the copolymerization component having the carboxyl group comprises a monomer represented by the following general formula (1):

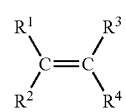

General formula (1)

wherein $R^1$ to $R^4$ each independently represent a hydrogen atom, an alkyl group, or an organic group represented by the following general formula (2), and at least one of $R^1$ to $R^4$ is an organic group represented by the following general formula (2):

—X—COOH          General formula (2)

wherein X represents a single bond, an alkylene group, an arylene group that may have a substituent, or any one of the following structural formulae (i) to (iii):

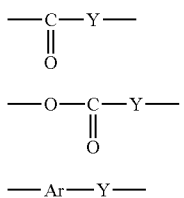

wherein Y represents a divalent connecting group, and Ar represents an arylene group that may have a substituent.

The third aspect of the invention is the photosensitive composition (P), wherein, in the vinyl polymer, a content of said copolymerization component including the carboxyl group is 2.2 meq/g or higher, meq/g representing a unit of millimolar equivalent of the carboxyl group per 1 g of the vinyl polymer.

The fourth aspect of the invention is the photosensitive composition (P), wherein the vinyl polymer comprises, as a copolymer component, an alkyl acrylate or an alkyl methacrylate both of which have a non-substituted alkyl group having 2 to 4 carbon atoms.

The fifth aspect of the invention is the photosensitive composition (P), wherein the vinyl polymer comprises, as a copolymer component, at least two selected from alkyl acrylates and alkyl methacrylates.

The sixth aspect of the invention is the photosensitive composition (P), wherein the vinyl polymer has a weight-average molecular weight of 15,000 to 200,000.

The seventh aspect of the invention is the photosensitive composition (P), wherein the polymer compound having the phenolic hydroxyl group is insoluble in water and alkali-soluble.

The eighth aspect of the invention is the photosensitive composition (P), wherein the vinyl polymer comprises, as a copolymer component, one of an alkyl acrylate and an alkyl methacrylate both of which have a linear alkyl group, and one of an alkyl acrylate and an alkyl methacrylate both of which have a branched alkyl group.

The ninth aspect of the invention is the photosensitive composition (P), further.

The tenth aspect of the invention is the photosensitive composition (P) comprising a decomposable dissolution inhibitor, wherein the decomposable dissolution inhibitor is a diazonium salt compound.

The eleventh aspect of the invention is the positive-type planographic printing plate precursor (Q) comprising an image recording layer produced by dissolving a photosensitive composition in a solvent to prepare a coating solution and coating the coating solution on a suitable substrate, the photosensitive composition including:

(A) a vinyl polymer containing a copolymerization component having a carboxyl group, the carboxyl group being contained in a molecule in an amount of 2.0 meq/g or greater, and the vinyl polymer having a solubility parameter less than 21.3 $MPa^{1/2}$;

(B) a polymer compound having a phenolic hydroxyl group; and (C) an IR absorber.

The twelfth aspect of the invention is the positive-type planographic printing plate precursor (Q), wherein a concentration of total solids in the coating solution is 1 to 50 mass %.

The thirteenth aspect of the invention is the positive-type planographic printing plate precursor (Q), wherein a content of the vinyl polymer in the image recording layer is 0.5 to 30 mass % based on total solids in the image recording layer.

The fourteenth aspect of the invention is the positive-type planographic printing plate precursor (Q), which is exposed by a solid state laser or a semiconductor laser.

The fifteenth aspect of the invention is the positive-type planographic printing plate precursor (Q), wherein a coating amount of the coating solution for producing the image recording layer is 0.5 to 5.0 $g/m^2$.

The sixteenth aspect of the invention is the positive-type planographic printing plate precursor (Q), wherein the copolymerization component having the carboxyl group includes a monomer represented by the foregoing general formula (1).

The seventeenth aspect of the invention is the positive-type planographic printing plate precursor (Q), wherein, in the vinyl polymer, a content of the copolymerization component having the carboxyl group is 2.2 meq/g or higher, meq/g representing a unit of millimolar equivalent of the carboxyl group per 1 g of the vinyl polymer.

The eighteenth aspect of the invention is the positive-type planographic printing plate precursor (Q), wherein the vinyl polymer comprises, as a copolymer component, at least two selected from alkyl acrylates and alkyl methacrylates.

The nineteenth aspect of the invention is the positive-type planographic printing plate precursor (Q), wherein the vinyl polymer comprises, as a copolymer component, one of an alkyl acrylate and an alkyl methacrylate both of which have a linear alkyl group, and one of an alkyl acrylate and an alkyl methacrylate both of which have a branched alkyl group.

The twentieth aspect of the invention is the positive-type planographic printing plate precursor (Q), wherein the vinyl polymer has a weight-average molecular weight of 15,000 to 200,000.

The specific vinyl polymer of the invention is used, in the photosensitive composition of the invention, as a binder mixed with the polymer compound having phenolic hydroxyl group. The widely employed polymer compound having the phenolic hydroxyl group exhibits an image forming property by an inhibition of dissolution of the coated film due to an interaction of the phenolic hydroxyl group, and a thermal release of such inhibition. The coated film has poor flexibility and is brittle because of the influence of such interaction. The coated film has a low resistance to the alkaline aqueous solution as an alkali dissolution channel is present in the molecule, resulting from an association of a plurality of alkali-soluble functional groups. On the other hand, the specific vinyl polymer employed in the invention, having a solubility parameter less than 21.3 $MPa^{1/2}$, has a low polarity, provides a highly flexible film and shows a high miscibility with the polymer compound having the phenolic hydroxyl group. Such specific polymer, used in combination with the polymer compound having the phenolic hydroxyl group improves the film forming property and the film strength of the entire composition. Its function, though not yet clarified, is presumably ascribable to a fact that the specific vinyl polymer of the invention seals the alkali dissolution channel of the polymer compound having the phenolic hydroxyl group thereby improving the resistance to the alkali aqueous solution, and that a uniform mixing of the specific vinyl polymer improves the flexibility of the film of the entire composition thereby suppressing generation of cracks resulting from brittleness.

Also the specific vinyl polymer comprises monomers having carboxyl groups in at least a certain amount as a copolymerization component. And the specific polymer is considered, in an unexposed area, to increase the resistance of the coated film to the alkali aqueous solution by interactions between the carboxyl groups and between the carboxyl group and the phenolic hydroxyl group, and, in an exposed area after exposure by an irradiation with IR, to increase the solubility in the alkali aqueous solution by the function of the carboxyl group (acid).

Based on the foregoing, in a case the photosensitive composition of the invention is applied as a image recording layer of a positive-type planographic printing plate precursor, an unexposed area (image area) forms a film excellent in resistance to the alikaline developer while an exposed area (non-image area) is promptly removed by the alkaline developer thereby suppressing generation of an undesired residual film. Consequently there can be obtained a planographic printing plate precursor excellent in a developing latitude and a printing durability.

DETAILED DESCRIPTION OF THE INVENTION

The photosensitive composition of the present invention is featured by including (A) a specific vinyl polymer, (B) a polymer compound having a phenolic hydroxyl group, which is an alkali-soluble resin, and (C) an IR absorber absorbing energy of light such as an IR light to generate heat. At first there will be given a detailed explanation on the specific vinyl polymer of the invention.

(A) A Vinyl Polymer Containing a Copolymerization Component Having a Carboxyl Group, Having a Content of the Carboxyl Group in a Molecule of 2.0 meq/g or Higher and Having a Solubility Parameter Less Than 21.3 MPa$^{1/2}$ The (A) vinyl polymer (specific vinyl polymer) containing a copolymerization component having a carboxyl group, having a content of the carboxyl group in a molecule of 2.0 meq/g or higher and having a solubility parameter less than 21.3 MPa$^{1/2}$ to be employed in the present invention is featured by that it has a monomer, having at least a kind of carboxyl group as a copolymerization component, that a content of the carboxyl group in the specific vinyl polymer is 2.0 meq/g or higher, and that the specific vinyl polymer has a solubility parameter less than 21.3 MPa$^{1/2}$.

The monomer having at least a kind of carboxyl group and employed as the copolymerization component of the specific vinyl polymer is not particularly limited as long as it includes a carboxyl group and a polymerizable double bond in the molecule, but a particularly preferred example includes a compound represented by the following general formula (1):

General formula (1)

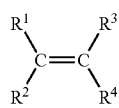

In the formula, R$^1$ to R$^4$ each independently represent a hydrogen atom, an alkyl group or an organic group represented by the following general formula (2) and at least one of R$^1$ to R$^4$ is an organic group represented by the following general formula (2). In consideration of copolymerizability and availability of raw materials in producing the specific vinyl polymer, R$^1$ to R$^4$ preferably include one or two organic groups represented by the general formula (2), and particularly preferably one organic group. Also in consideration of the flexibility of the specific vinyl polymer obtained as a result of polymerization, each of R$^1$ to R$^4$ other than those constituting the organic group represented by the general formula (2) is preferably an alkyl group or a hydrogen atom, particularly preferably a hydrogen atom.

Also for similar reasons, in a case all of R$^1$ to R$^4$ is an alkyl group, it is preferably an alkyl group with 1 to 4 carbon atoms and particularly preferably a methyl group.

—X—COOH    General formula (2)

In the formula, X represents a single bond, an alkylene group, an arylene group that may have a substituent, or any of following structural formulas (i) to (iii), and, in consideration of polymerizability, availability etc., it is preferably a single bond, an arylene group represented by a phenylene group, or a group represented by the following structure (i), and particularly preferably a single bond.

In the formula, Y represents a divalent connecting group, and Ar represents an arylene group that may have a substituent. Y is preferably an alkylene group with 1 to 16 carbon atoms or a single bond, and a methylene (—CH$_2$—) in the alkylene group may be substituted by an ether bond (—O—), a thioether bond (—S—), an ester bond (—COO—), or an amide bond (—CONR—; R being a hydrogen atom or an alkyl group), and the bond substituting methylene is preferably an ether bond or an ester bond.

Particularly preferred examples of such divalent connecting group are shown in the following:

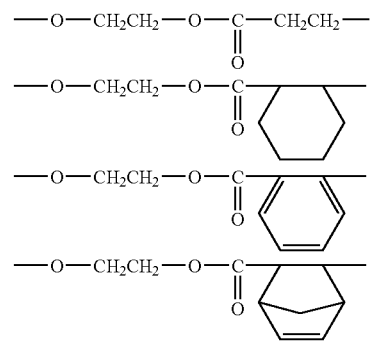

In the following, there are shown particularly preferred examples of the monomer having a carboxyl group, represented by the general formula (1), but the present invention is not limited by such examples.

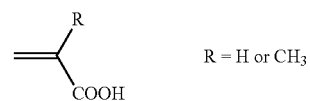

R = H or CH$_3$

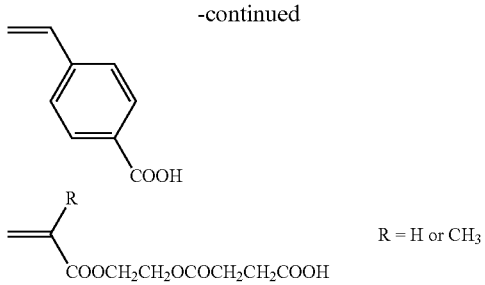

Such monomer having carboxyl group is singly polymerized or copolymerized with another copolymerization component, and its content in the specific vinyl polymer employed in the invention has to be 2.0 meq/g or higher (in millimolar equivalent of carboxyl group in 1 g of vinyl polymer) in order to secure the alkaline developability, preferably 2.2 meq/g or higher. The content of the carboxyl group has no particular upper limit, but is preferably less than 5.0 meq/g in order to secure a hydrophobic property of the composition and to maintain satisfactory physical properties of the film.

The specific vinyl polymer employed in the invention is also featured, in addition to the content of carboxyl group of 2.0 meq/g or higher, in having a solubility parameter less than 21.3 MPa$^{1/2}$. The solubility parameter used herein is a value estimated according to a theoretical formula proposed by Toshinao Okitsu (Journal of the Adhesion Society of Japan, Vol. 29, No. 6 (1993), pp. 249–259), adopting a value weighted by a molar ratio of the copolymerization component.

In order to regulate the solubility paratmer of the specific vinyl polymer to a value less than 21.3 MPa$^{1/2}$, the vinyl polymer of the invention is preferably a copolymer of the monomer containing carboxyl group and another monomer. This is because a homopolymer of the monomer containing carboxyl group has an excessively high solubility parameter. The copolymerizaton component is not particularly limited as long as it is a monomer component capable of copolymerizing with the monomer containing carboxyl group and has a property of reducing the solubility parameter of the specific vinyl polymer. Preferred examples of such copolymerization component are shown in the following (1) to (11):

(1) an acrylate ester and a methacrylate ester, having an aliphatic hydroxyl group, such as 2-hydroxyethyl acrylate and 2-hydroxyethyl methacrylate;
(2) an alkyl acrylate such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate;
(3) an alkyl methacrylate such as methyl methacrylate, ethyl methacrylate, propyl methacrylate, isopropyl methacrylate, butyl methacrylate, isobutyl methacrylate, amyl methacrylate, hexyl methacrylate, cyclohexyl methacrylate, 2-ethylhexyl methacrylate, benzyl methacrylate, 2-chloroethyl methacrylate, glycidyl methacrylate, and N-dimethylaminoethyl methacrylate;
(4) An acrylamide or a methacrylamide such as acrylamide, methacrylamide, N-methylol acrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, N,N-dimethylacrylamide, N,N-diisopropylacrylamide, and acryloylmorpholine;
(5) a vinyl ether such as ethyl vinyl ether, 2-chloroethyl vinyl ether, hydroxyethyl vinyl ether, propyl vinyl ether, butyl vinyl ether, octyl vinyl ether and phenyl vinyl ether;
(6) a vinyl ester such as vinyl acetate, vinyl chloroacetate, vinyl butyrate and vinyl benzoate;
(7) a styrene such as styrene, α-methylstyrene, methylstyrene, and chloromethylstyrene;
(8) a vinyl ketone such as methyl vinyl ketone, ethyl vinyl ketone, propyl vinyl ketone, or phenyl vinyl ketone;
(9) an olefin such as ethylene, propylene, isobutylene, butadiene or isoprene;
(10) N-vinylpyrrolidone, N-vinylcarbazole, 4-vinylpyridine, acrylonitrile, methacrylonitrile, and the like; and
(11) an unsaturated imide such as N-acryloyl acrylamide, N-acetyl methacrylamide, N-propionyl methacrylamide, or N-(p-chlorobenzoyl) methacrylamide.

Among these copolymerization components (1) to (11), in order to control the solubility parameter at a value less than 21.3 MPa$^{1/2}$ and to improve the film forming property, there are preferred (2) an alkyl acrylate, (3) an alkyl methacrylate, (4) an acrylamide or a methacrylamide and (7) a styrene, more preferably (2) an alkyl acrylate and (3) an alkyl methacrylate, and, in consideration of the flexibility of the specific polymer obtained by the polymerization, most preferred is (2) an alkyl acrylate.

Also in a case of employing (2) alkyl acrylate or (3) alkyl methacrylate as the copolymerization component, there is particularly preferred an alkyl acrylate or an alkyl methacrylate having a non-substituted alkyl group, and such non-substituted alkyl group can be linear or branched. The alkyl group preferably has 2 to 8 carbon atoms, particularly preferably 2 to 4 carbon atoms. Also in consideration of the miscibility with the polymer compound having the phenolic hydroxyl group, the alkyl acrylate or alkyl methacrylate to be copolymerized with the monomer containing the carboxyl group is preferably used in a mixture of two or more kinds thereof, and it is particularly preferred to execute the copolymerization employing alkyl acrylate or alkyl methacrylate of linear type and that of branched type in combination.

The specific vinyl polymer of the invention preferably has a weight-averaged molecular weight of 15,000 to 200,000, further preferably 25,000 to 100,000 and particularly preferably 32,000 to 70,000. A molecular weight within such range provides a sufficient film formation and a high alkali solubility in an exposed area to the IR irradiation.

Also in a case the photosensitive composition of the invention is used as a image recording layer of a planographic printing plate, a content of the specific vinyl polymer on the basis of the total solid of the image recording layer is preferably 0.5 to 30 mass %, more preferably 0.5 to 20 mass %. A content of 0.5 mass % or less results in a narrow developing latitude, while a content exceeding 30 mass % tends to deteriorate the sensitivity and cannot provide a sufficient improvement in printing durability by a post-baking.

The specific vinyl polymer of the invention can be synthesized with a known radical polymerization initiator and in a method already known in the art, such as graft copolymerization, block copolymerization or random copolymerization.

Among such specific vinyl polymers, examples of those advantageously employable according to the invention are shown in the following, but the present invention is not limited by such examples. In these examples, a parenthesized number indicates a solubility parameter (MPa$^{1/2}$) of each unit, while (1) represents a carboxyl group content (meq/g) and (2) represents a solubility parameter (MPa$^{1/2}$) of the polymer.
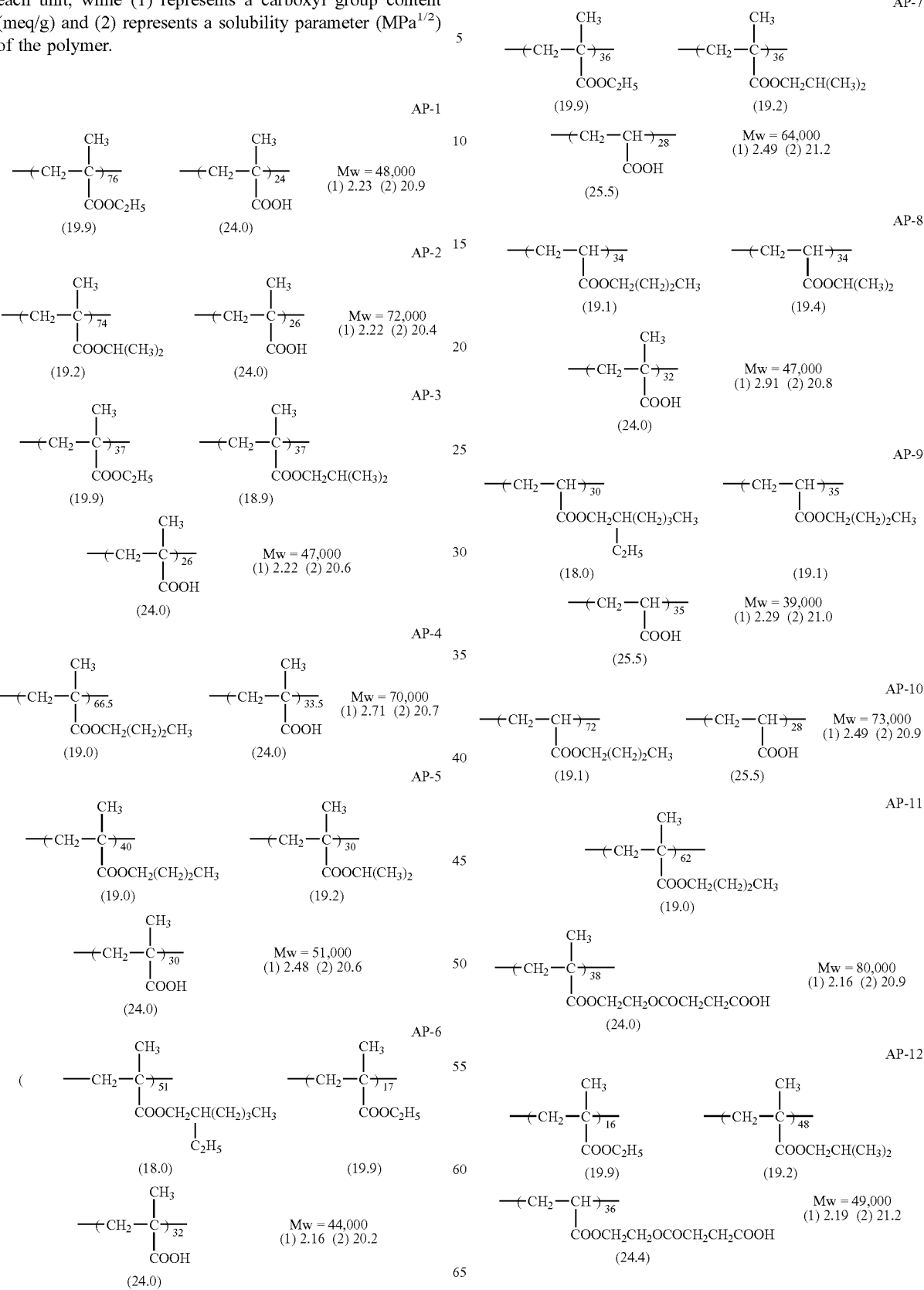

-continued

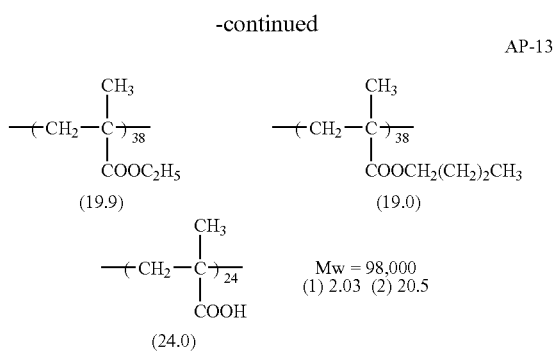

AP-13

(B) Polymer Compound Having Phenolic Hydroxyl Group

The polymer compound having the phenolic hydroxyl group, employed as an alkali soluble resin according to the invention, can be any polymer compound that is insoluble in water but soluble in alkali and has a phenolic hydroxyl group in the molecule. Specifically, it can be a novolac resin, a resol resin, a polyvinylphenol resin, and an acrylic resin having a phenolic hydroxyl group. Among these, a novolac resin, a resol resin and a polyvinyl phenol resin are preferred in consideration of the image forming property and the thermosetting property, and a novolac resin and a polyvinyl phenol resin are more preferred in consideration of the stability, and a novolac resin is particularly preferred in consideration of the availablity of the raw material and the applicability in general.

A novolac resin means a resin obtained by polycondensation of at least one of phenols such as phenol, o-cresol, m-cresol, p-cresol, 2,5-xylenol, 3,5-xylenol, o-ethylphenol, m-ethylphenol, p-ethylphenol, propylphenol, n-butylphenol, tert-butylphenol, 1-naphthol, 2-naphthol, pyrocathecol, resorcinol, hydroquinone, pyrogallol, 1,2,4-benzenetriol, fluoroglucinol, 4,4'-biphenyldiol, and 2,2-bis(4'-hydroxyphenyl)propane, in the presence of an acidic catalyst, and at least one of aldehydes such as formaldehyde, acetaldehyde, propionaldehyde, benzaldehyde and furfural (formaldehyde or acetaldehyde being respectively replaceable by para-formaldehyde or para-aldehyde), and ketones such as acetone, methyl ethyl ketone, and methyl isobutyl ketone.

In the invention, there is preferred a polycondensate of at least one of phenol, o-cresol, m-cresol, p-cresol, 2,5-xylenol, 3,5-xylenol or resorcinol (as the phenol), and at least one of formaldehyde, acetaldehyde or propionaldehyde (as the aldehyde or ketone), and there is particularly preferred a polycondensate of mixed phenols of m-cresol:p-cresol:2,5-xylenol:3,5-xylenol:resorcinol in a molar mixing ratio of 40–100:0–50:0–20:0–20:0–20 or mixed phenols of phenol: m-cresol:p-cresol in a molar mixing ratio of 0–100:0–70: 0–60, and formaldehyde.

The positive-type photosensitive composition of the invention preferably includes a dissolution inhibitor to be explained later, and, in such a case, there is preferred a polycondensate of mixed phenols of m-cresol:p-cresol:2,5-xylenol:3,5-xylenol:resorcinol in a molar mixing ratio of 70–100:0–30:0–20:0–20:0–20 or mixed phenols of phenol: m-cresol:p-cresol in a molar mixing ratio of 10–100:0–60: 0–40, and formaldehyde.

Such novolac resin preferably has a polystyrene-converted weight-averaged molecular weight measured by gel permeation chromatography (hereinafter simply called weight-averaged molecular weight) within a range of 500 to 20,000, more preferably 1,000 to 15,000 and particularly preferably 3,000 to 12,000. A weight-averaged molecular weight within such range provides a film with sufficient film formation property and a high alkali solubility in an exposed area to the IR irradiation.

(C) IR Absorber

An IR absorber, to be employed in the invention, can be any substance capable of absorbing an optical energy radiation and generating heat, without particular limitation on the absorption wavelength range. In consideration of suitability for an easily available high power laser, an IR absorbing dye or an IR absorbing pigment, having an absorption maximum in a wavelength region of 760 to 1200 nm is preferably employed.

The usable dye can be commercially available dyes and known ones described for example in "Senryo Binran (Dye Handbook)" (edited by Organic Synthetic Chemical Society, 1970). Specific examples of such dye include azo dyes, metal complex azo dyes, pyrazolone azo dyes, naphthoquinone dyes, anthraquinone dyes, phthalocyanine dyes, carbonium dyes, quinonimine dyes, methine dyes, cyanine dyes, squarylium dyes, pyrylium dyes, metal thiolate dyes, oxonol dyes, diimonium dyes, aminium dyes and chroconium dyes.

Preferred dyes include cyanine dyes described in JP-A Nos. 58-125246, 59-84356, 59-202829 and 60-78787, methine dyes described in JP-A Nos. 58-173696, 58-181690 and 58-194595, naphthoquinone dyes described in JP-A Nos. 58-112793, 58-224793, 59-48187, 59-73996, 60-52940 and 60-63744, squarylium dyes described in JP-A No. 58-112792 and cyanine dyes described in BP No. 434,875.

There can also be advantageously employed a near IR absorbing sensitizer described in U.S. Pat. No. 5,156,938, and there can be preferably employed substituted arylbenzo(thio)pyrylium salts described in U.S. Pat. No. 3,881,924, trimethinethiapyrylium salts described in JP-A No. 57-142645 (U.S. Pat. No. 4,327,169), pyrylium compounds described in JP-A Nos. 58-181051, 58-220143, 59-41363, 59-84248, 59-84249, 59-146063 and 59-146061, cyanine dyes described in JP-A No. 59-216146, pentamethinethiopyrylium salts described in U.S. Pat. No. 4,283,475 and pyrylium compounds described in JP-B No. 5-13514 and 5-19702.

Also another preferred example of the dye is near IR absorbing dyes described in U.S. Pat. No. 4,756,993 as formulas (I) and (II).

Among these dyes, particularly preferred are cyanine dyes, phthalocyanine dyes, oxonol dyes, squarylium dyes, pyrylium salts, thiopyrylium dyes and nickel thiolate complexes. Further, dyes represented by following general formulae (a) to (e) are preferred because of their excellent photothermal converting efficiency, and, a cyanine dye represented by the following general formula (a) is most preferable as it interacts strongly with the alkali soluble resin and is excellent in stability and economy when employed in the photosensitive composition of the invention.

General Formula (a)

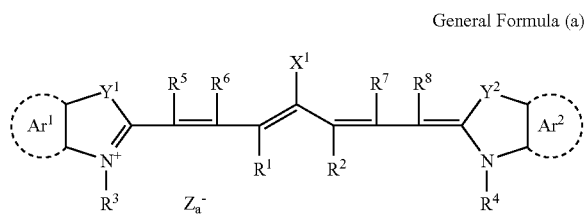

In the general formula (a), $X^1$ represents a hydrogen atom, a halogen atom, —$NPh_2$, $X^2$-$L^1$ or the following group; $X^2$ represents an oxygen atom or a nitrogen atom; $L^1$ represents a hydrocarbon group with 1 to 12 carbon atoms, an aromatic ring having a hetero atom or a hydrocarbon group with 1 to 12 carbon atoms including a hetero atom. Here, a hetero atom means N, S, O, a halogen atom or Se.

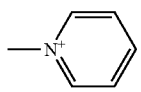

$R^1$ and $R^2$ each independently represent a hydrocarbon group having 1 to 12 carbon atoms. In consideration of shelf stability of an image recording layer coating solution, each of $R^1$ and $R^2$ is preferably a hydrocarbon group with 2 or more carbon atoms, and more preferably $R^1$ and $R^2$ are mutually bonded to form a five-membered ring or a six-membered ring.

$Ar^1$ and $Ar^2$, which may be same or different, each represent an aromatic hydrocarbon group which may have a substituent. Preferred examples of the aromatic hydrocarbon group include a benzene ring and a naphthalene ring. Also preferred examples of the substituent include a hydrocarbon group with 12 or less carbon atoms, a halogen atom, and an alkoxy group with 12 or less carbon atoms. $Y^1$ and $Y^2$, which may be same or different, each represent a sulfur atom or a dialkylmethylene group with 12 or less carbon atoms. $R^3$ and $R^4$, which may be same or different, each represent a hydrocarbon group with 20 or less carbon atoms, which may have a substituent. Preferred examples of the substituent include an alkoxy group with 12 or less carbon atoms, a carboxyl group and a sulfo group. $R^5$, $R^6$, $R^7$ and $R^8$, which may be same or different, each represent a hydrogen atom, or a hydrocarbon group with 12 or less carbon atoms. Hydrogen atom is preferred because of the availability of the raw material. $Z_a^-$ represents a counter anion. However, $Z_a^-$ is not required in a case any of $R^1$ to $R^8$ is substituted with a sulfo group. In consideration of the shelf stability of an image recording layer coating solution, $Z_a^-$ is preferably a halogen ion, a perchlorate ion, a tetrafluoroborate ion, a hexafluorophosphate ion, or a sulfonate ion, and particularly preferably a perchlorate ion, a hexafluorophosphate ion or an arylsulfonate ion.

Specific examples of the cyanine dyes represented by the general formula (a) and advantageously employable according to the invention are described, in addition to those shown in the following, in paragraphs [0017] to [0019] of JP-A No. 2001-133969, paragraphs [0012] to [0038] of JP-A No. 2002-40638, and paragraphs [0012] to [0023] of JP-A No. 2002-23360.

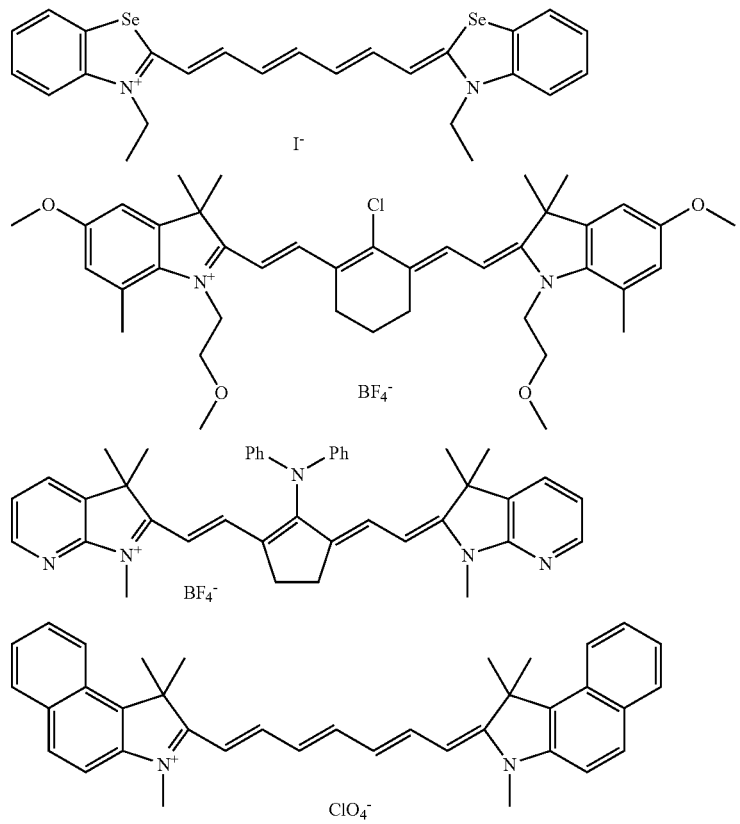

-continued
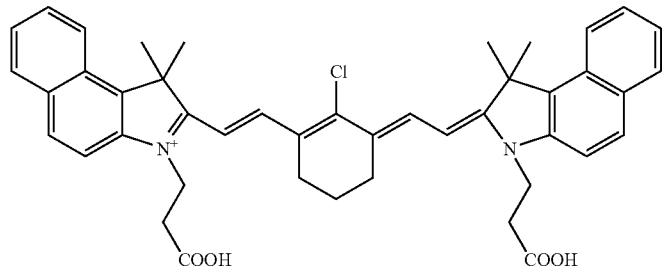 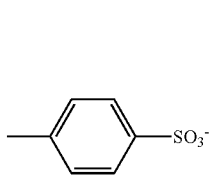
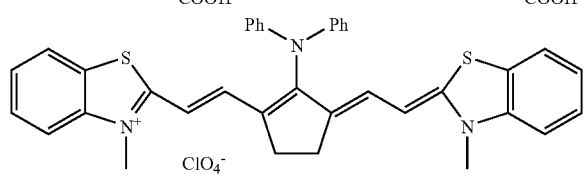
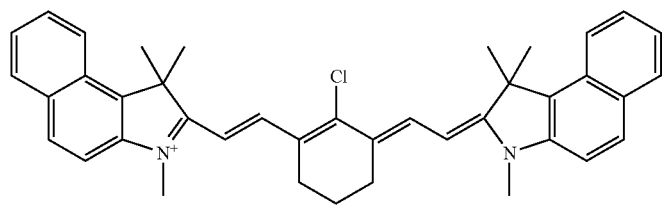 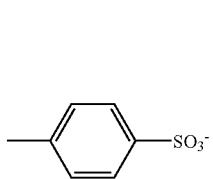
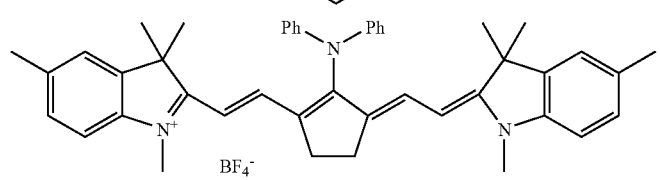
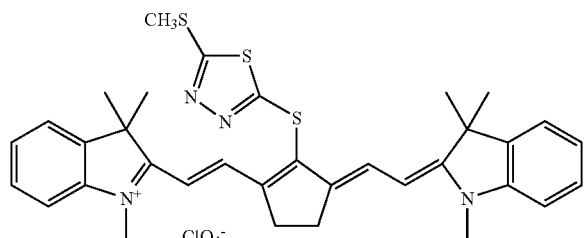
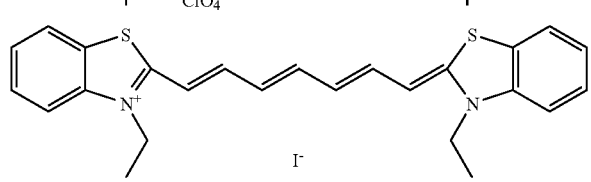
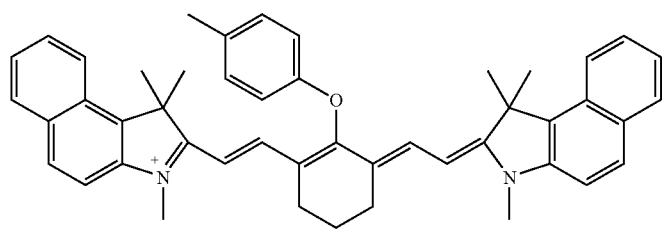 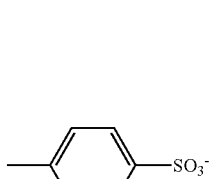
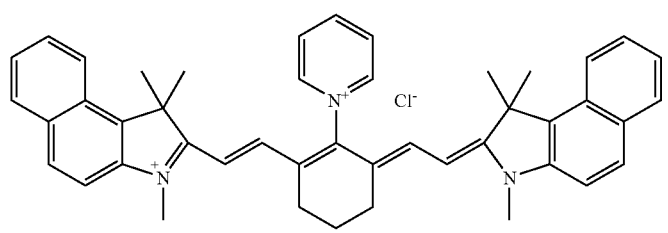 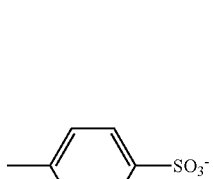

-continued

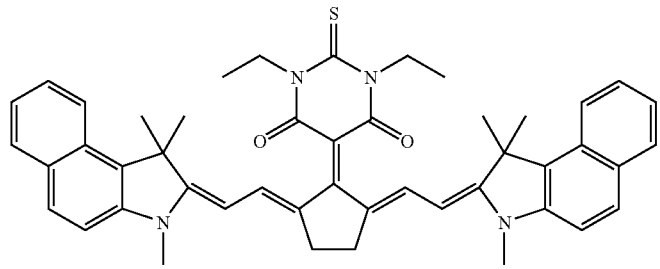

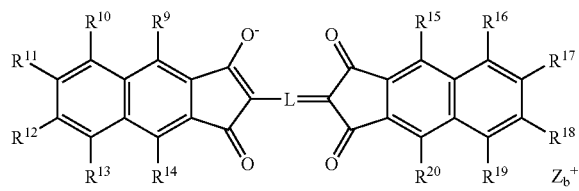

General Formula (b)

In the foregoing general formula (b), L represents a methine chain with 7 or more conjugate carbon atoms in which the methine chain may have a substituent and the substitutents may be mutually bonded to form a ring structure. $Z_b^+$ represents a counter cation. Preferred examples of the counter cation include ammonium, iodonium, sulfonium, phosphonium, pyridinium and an alkali metal cation ($Ni^+$, $K^+$, $Li^+$). $R^9$ to $R^{14}$ and $R^{15}$ to $R^{20}$ each independently represent a substituent group selected from a hydrogen atom, a halogen atom, a cyano group, an alkyl group, an aryl group, an alkenyl group, an alkinyl group, a carbonyl group, a thio group, a sulfonyl group, a sulfinyl group, an oxy group and an amino group, or a substituent group formed by a combination of two or three of these groups, and they may be mutually bonded to form a ring structure. Among those represented by the general formula (b), there is preferred one in which L represents a methine chain with 7 conjugate carbon atoms and $R^9$ to $R^{14}$ and $R^{15}$ to $R^{20}$ all represent hydrogen atoms in consideration of the availability and the effect.

Specific examples of the dye represented by the general formula (b) and advantageously employable according to the invention are shown in the following:

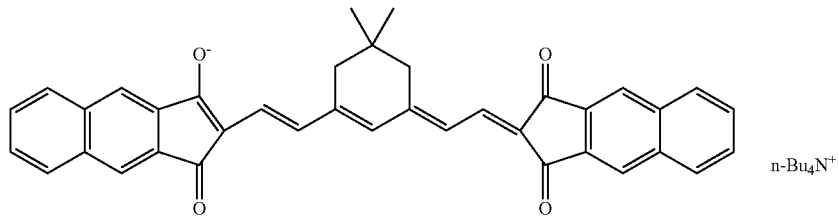

n-Bu$_4$N$^+$

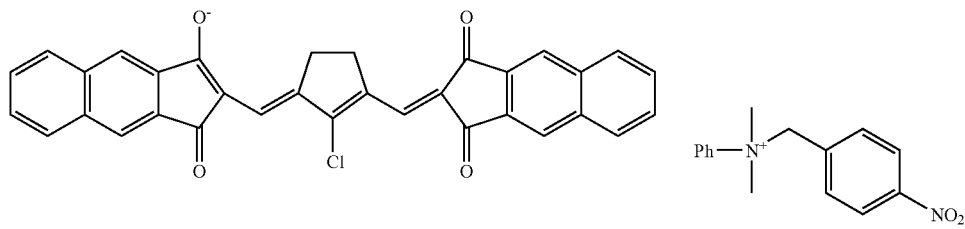

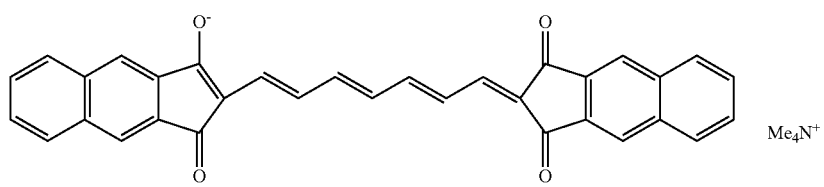

Me$_4$N$^+$

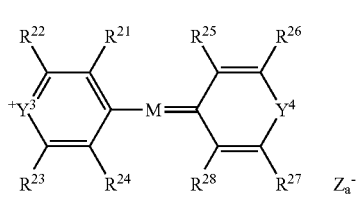

General Formula (c)

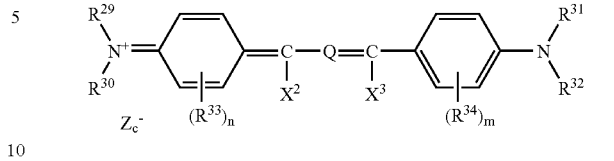

General Formula (d)

In the general formula (c), $Y^3$ and $Y^4$ each represent an oxygen atom, a sulfur atom, a selenium atom or a tellurium atom; M represents a methine group with 5 or more conjugate carbon atoms; $R^{21}$ to $R^{24}$ and $R^{25}$ to $R^{28}$, which may be same or different, each represent a hydrogen atom, a halogen atom, a cyano group, an alkyl group, an aryl group, an alkenyl group, an alkinyl group, a carbonyl group, a thio group, a sulfonyl group, a sulfinyl group, an oxy group or an amino group; and $Za^-$ represents a counter anion and has the same meaning as $Za^-$ in the general formula (a).

Specific examples of the dye represented by the general formula (c) and advantageously employable according to the invention are shown in the following:

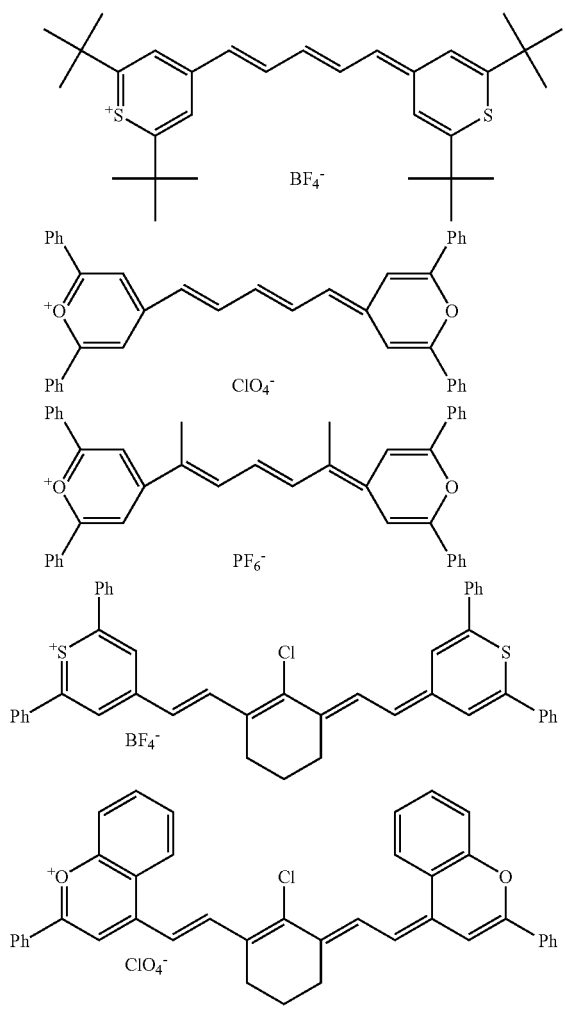

In the general formula (d), $R^{29}$ to $R^{31}$ each independently represent a hydrogen atom, an alkyl group or an aryl group; $R^{33}$ and $R^{34}$ each independently represent an alkyl group, a substituted oxy group or a halogen atom; n and m each independently represents an integer from 0 to 4; $R^{29}$ and $R^{30}$, or $R^{31}$ and $R^{32}$ may be mutually bonded to form a ring, also $R^{29}$ and/or $R^{30}$ may be bonded to $R^{33}$ to form a ring, and $R^{31}$ and/or $R^{32}$ may be bonded to $R^{34}$ to form a ring, and in a case $R^{33}$ or $R^{34}$ is present in a plurality, such $R^{33}$s may be bonded to each other to form a ring and such $R^{34}$s may be bonded to each other to form a ring; $X^2$ and $X^3$ each independently represent a hydrogen atom, an alkyl group or an aryl group and at least one of $X^2$ and $X^3$ represents a hydrogen atom or an alkyl group; Q represents a trimethine group or a pentamethine group which may be substituted and which may form a ring structure cooperatively with a divalent organic group; and $Zc^-$ represents a counter anion and has the same meaning as $Za^-$ in the general formula (a).

Specific examples of the dye represented by the general formula (d) and advantageously employable according to the invention are shown in the following:

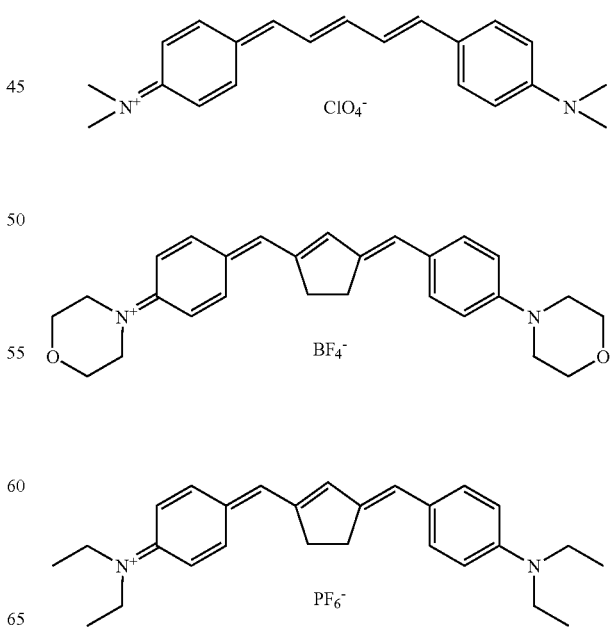

General Formula (e)

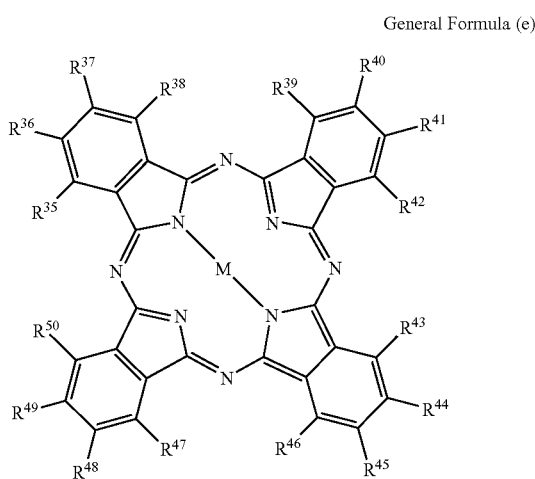

In the general formula (e), $R^{31}$ to $R^{50}$ each independently represent a hydrogen atom, a halogen atom, a cyano group, an alkyl group, an aryl group, an alkenyl group, an alkinyl group, a hydroxyl group, a carbonyl group, a thio group, a sulfonyl group, a sulfinyl group, an oxy group, an amino group or an onium salt structure, which may have a substituent. M represents two hydrogen atoms, a metal atom, a halometal group or an oxymetal group, in which the metal atom contained therein can be an atom of group IA, IIA, IIIB or IVB of the periodic table, a transition metal of the first, second or third period, or a lanthanoid element, among which preferred are copper, magnesium, iron, zinc, cobalt, aluminum, titanium and vanadium.

Specific examples of the dye represented by the general formula (e) and advantageously employable according to the invention are shown in the following:

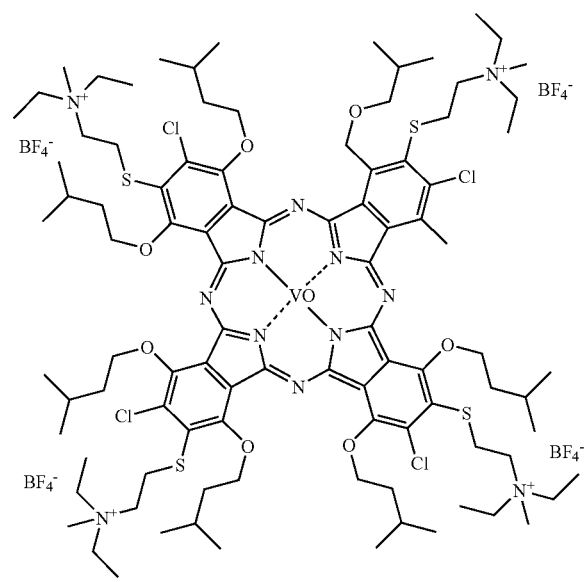

-continued

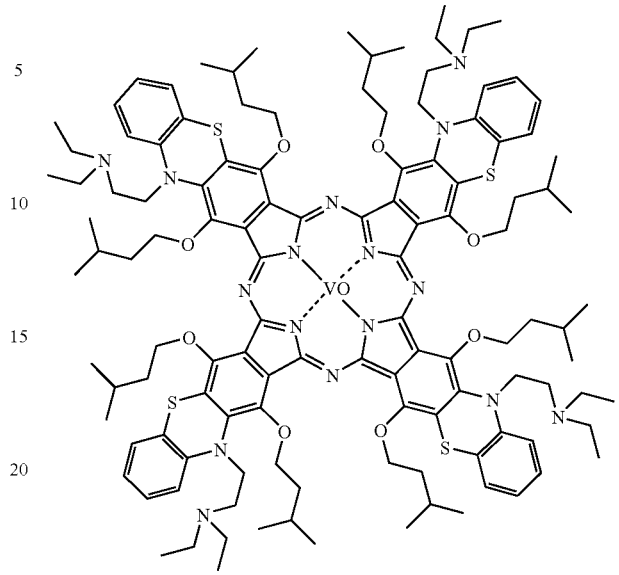

Examples of the pigment employable as the IR absorber in the invention include commercially available pigments and pigments described in Color Index (C.I.), "Saishin Ganryo Binran" (Pigment Technology Society of Japan, 1977), "Saishin Ganryo Ouyou Gijutsu" (CMC Press, 1986), and "Insatsu Ink Gijutsu" (CMC Press, 1984).

The type of the pigment can be a black pigment, a yellow pigment, an orange pigment, a brown pigment, a red pigment, a purple pigment, a blue pigment, a green pigment, a fluorescent pigment, a metal power pigment, or a polymer bonded pigment. Specific examples include insoluble azo pigments, azo lake pigments, condensed azo pigments, chelate azo pigments, phthalocyanine pigments, anthraquinone pigments, perylene and perynone pigments, thioindigo pigments, quinachrydone pigments, dioxazine pigments, isoindolinone pigments, quinophthalone pigments, lake pigments, azine pigments, nitroso pigments, nitro pigments, natural pigments, fluorescent pigments, inorganic pigments and carbon black, among which preferred is carbon black.

These pigments may be used with or without a surface treatment. The surface treating method can be, for example, a method of surface coating with resin or wax, a method of depositing a surfactant, or a method of bonding a reactive substance (for example a silane coupling agent, an epoxy compound or polyisocyanate) to the pigment surface. These surface treating methods are described in "Kinzoku Sekken no Seishitsu to Ouyou (Properties and Applications of Metal Soaps)" (Saiwai Shobo), "Insatsu Ink Gijutsu (Printing Ink Technology)" (CMC Press, 1984) and "Saishin Ganryo Ouyou Gijutsu (Latest Pigment Application Technology)" (CMC Press, 1986).

The particle size of the pigment is preferably within a range of 0.01 to 10 μm, more preferably 0.05 to 1 μm and most preferably 0.1 to 1 μm. A particle size of the pigment less than 0.01 μm is undesirable in view of the stability of dispersion in an image recording layer coating solution, and a particle size exceeding 10 μm is undesirable in view of the uniformity of the image recording layer.

For dispersing the pigment, there can be used a known technology employed in ink manufacture or toner manufacture. A dispersing machine can be an ultrasonic dispersing device, a sand mill, an Attoritor®, a pearl mill, a super mill, a ball mill, an impeller, a disperser, a KD mill, a colloid mill, a dynatron, a three-roll mill or a pressurizing kneader. Details are described in "*Saishin Ganryo Ouyou Gijutsu* (Latest Pigment Application Technology)" (CMC Press, 1986).

Such pigment or dye may be added, on the basis of the mass of the entire solids constituting the image recording layer, in an amount of 0.01 to 50 wt. %, preferably 0.1 to 10 wt. %, and particularly preferably 0.5 to 10 wt. % in case of a dye and particularly preferably 0.1 to 10 wt. % in case of a pigment. An addition amount of the pigment or the dye less than 0.01 wt. % tends to reduce the sensitivity, while an addition amount exceeding 50 wt. % may results in undesirable influences on the uniformity of the image recording layer and the durability of the image recording layer with an increase of the amount.

Other Components

In forming the photosensitive composition of the invention, various additives may be further added according to the necessity. For example, it is preferable, for enhancing the inhibition of dissolution of an image portion in the developer, to use in combination a substance which is thermally decomposable and is capable, in an undecomposed state, of substantially reducing the solubility of the alkali soluble polymer resin (a decomposable dissolution inhibitor), such as an onium salt, an o-quinonediazide compound, or a sulfonic acid alkyl ester. As a decomposable dissolution inhibitor there are preferred an onium salt such as a diazonium salt, an iodonium salt, a sulfonium salt or an ammonium salt, and an o-quinonediazide compound, and more preferred is an onium salt which is a diazonium salt, an iodonium salt or a sulfonium salt.

Preferred examples of the onium salt to be employed in the invention include diazonium salts described by S. I. Schlesinger, Photogr. Sci. Eng., 18, 387(1974), T. S. Bal et al., Polymer, 21, 423(1980) and in JP-A No. 5-158230; ammonium salts described in U.S. Pat. Nos. 4,069,055 and 4,069,056 and JP-A No.3-140140; phosphonium salts described by D. C. Necker et al., Macromolecules, 17, 2468(1984), C. S. Wen et al., Teh. Proc. Conf. Rad. Curing ASIA, p. 478 Tokyo, October (1988), U.S. Pat. Nos. 4,069,055 and 4,069,056; iodonium salts described by J. V. Crivello et al., Macromolecules, 10(6), 1307(1977), Chem & Eng. News, November 28, p. 31(1988), European Patent No. 104,143, U.S. Pat. Nos. 5,041,358 and 4,491,628, JP-A Nos. 2-150848 and 2-296514; sulfonium salts described by J. V. Crivello et al., Polymer J. 17, 73(1985), J. V. Crivello et al., J. Org. Chem., 43, 3055(1978), W. R. Watt et al., J. Polymer Sci., Polymer Chem. Ed., 22, 1789(1984), J. V. Crivello et al., Polymer Bull., 14, 279(1985), J. V. Crivello et al., Macromolecules, 14(5), 1141(1981), J. V. Crivello et al., J. Polymer Sci., Polymer Chem. Ed., 17, 2877(1979), European Patents Nos. 370,693, 233,567, 297,443 and 297,442, U.S. Pat. Nos. 4,933,377, 3,902,114, 5,041,358, 4,491,628, 4,760,013, 4,734,444 and 2,833,827, German patents Nos. 2,904,626, 3,604,580 and 3,604,581; selenonium salts described by J. V. Crivello et al., Macromolecules, 10(6), 1307(1977), J. V. Crivello et al., J. Polymer Sci., Polymer Chem. Ed., 17, 1047(1979); and arsonium salts described by C. S. Wen et al., Teh. Proc. Conf. Rad. Curing ASIA, p. 478 Tokyo, October (1988).

Among these onium salts, diazonium salts are particularly preferred in consideration of the dissolution inhibiting ability and the thermal decomposing property. Particularly preferred are a diazonium salt represented by a general formula (I) in JP-A No. 5-158230 and a diazonium salt represented by a general formula (I) in JP-A No. 11-143064, and most preferred is a diazonium salt having small absorbance in the visible region, represented by a general formula (I) in JP-A No. 11-143064.

As a counter ion to the onium salt, there can be employed, for example, tetrafluoroboric acid, hexafluorophosphoric acid, triisopropylnaphthalene sulfonic acid, 5-nitro-o-toluene sulfonic acid, 5-sulfosalicylic acid, 2,5-dimethylbenzene sulfonic acid, 2,4,6-trimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and paratoluene sulfonic acid. Among these, particularly preferred are hexafluorophosphoric acid and an alkylaromatic sulfonic acid such as triisopropyl-naphthalene sulfonic acid or 2,5-dimethylbenzene sulfonic acid.

As a preferred quionediazide, there can be employed an o-quinonediazide compound. The o-quinonediazide compound employable according to the invention has at least an o-quinonediazide group and increases solubility in alkali by pyrolysis, and can assume various structures. The quinonediazide enhances the solubility of the photosensitive system by effects that the o-quinonediazide loses an ability of inhibiting dissolution of a binder upon pyrolysis and o-quinonediazide itself changes to an alkali-soluble substance. As such o-quinonediazide compound employable according to the invention, there can be used compounds described in J. Cosar, "Light-sensitive Systems" (John Wiley & Sons. Inc.), p. 339–352, and there can be particularly advantageously employed a sulfonic acid ester or a sulfonic acid amide of o-quinonediazide obtained by reaction between the o-quinonediazide compound and various aromatic polyhydroxy compounds or aromatic amino compounds. There can also be advantageously employed an ester between benzoquinone-(1,2)-diazide sulfonic acid chloride or naphthoquinone-(1,2)-diazide-5-sulfonic acid chloride and pyrogallol-acetone resin as described in JP-B No. 43-28403, and an ester between benzoquinone-(1,2)-diazidesulfonic acid chloride or naphthoquinone-(1,2)-diazide-5-sulfonic acid chloride and phenol-formaldehyde resin as described in U.S. Pat. Nos. 3,046,120 and 3,188,210.

There can also be advantageously employed an ester between naphthquinone-(1,2)-diazide-4-sulfonic acid chloride and phenol-formaldehyde resin or cresol-formaldehyde resin, and an ester between naphthoquinone-(1,2)-diazide-4-sulfonic acid chloride and pyrogallol-acetone resin. Other useful o-quinonediazide compounds are known and reported in various patents, for example JP-A Nos. 47-5303, 48-63802, 48-63803, 48-96575, 49-38701 and 48-13354, JP-B Nos. 41-11222, 45-9610 and 49-17481, U.S. Pat. Nos. 2,797,213, 3,454,400, 3,544,323, 3,573,917, 3,674,495 and 3,785,825, British Patents Nos. 1,227,602, 1,251,345, 1,267,005, 1,329,888 and 1,330,932 and German Patent No. 854,890.

The amount of addition of onium salt and/or o-quinonediazide compounds as the decomposable dissolution inhibitor, with respect to the mass of the total solids of the image recording layer, is preferably 0 to 10 mass %, more preferably 0 to 5 mass % and most preferably 0 to 2 mass %. These compounds may be used singly or in a mixture of plural kinds.

The addition amount of additives other than o-quinonediazide compound is preferably 0 to 5 mass %, more preferably 0 to 2 mass %, and most preferably 0.1 to 1.5 mass %. The additives and the binder employed according to the invention are preferably contained in a same layer.

It is also possible to use, in combination, a non-decomposable dissolution inhibitor. And the preferred dissolution inhibitor can be, for example, a sulfonic acid ester, a phosphoric acid ester, an aromatic carboxylic acid ester, an aromatic disulfone, a carboxylic acid anhydride, an aromatic ketone, an aromatic aldehyde, an aromatic amine, or an aromatic ether described in detail in JP-A No. 10-268512, a dye capable of developing color with an acid, having a a lactone skeleton, an N,N-diarylamide skeleton or a diarylmethylimino skeleton and serving also as a coloring agent, as described in detail in JP-A No. 11-190903, or a nonionic surfactant described in detail in JP-A No. 2000-105454.

It is also possible, for increasing an image discrimination (distinction of hydrophobicity and hydrophilicity) or increasing a resistance to a surface scratch, to employ in combination a polymer including, as a polymerization component, a (meth)acrylate monomer having two or three perfluoroalkyl groups with 3 to 20 carbon atoms in the molecule as described in JP-A No. 2000-187318. An amount of addition of such compound, in a case the photosensitive composition of the invention is applied in a photosensitive layer of a planographic printing plate, is preferably 0.1 to 10 mass % with respect to the mass of the total solids of the photosensitive layer, more preferably 0.5 to 5 mass %.

In the photosensitive composition of the invention, in order to provide a resistance to a scratch, it is possible to add a compound capable of reducing a static friction coefficient of the surface. More specifically, there can be employed an ester of a long-chain alkylcarboxylic acid as described in U.S. Pat. No. 6,117,913. An amount of addition of such compound, in a case the photosensitive composition of the invention is applied in a photosensitive layer of a planographic printing plate, is preferably 0.1 to 10 mass % with respect to the mass of the total solids of the photosensitive layer, more preferably 0.5 to 5 mass %.

Also the photosensitive composition of the invention may include a compound of a low molecular weight having an acidic group, if necessary. The acidic group can be a sulfonic acid group, a carboxylic acid group or a phosphoric acid group. Among these, a compound having a sulfonic acid group is preferred. Specific examples include an aromatic sulfonic acid such as p-toluenesulfonic acid, naphthalenesulfonic acid, and an aliphatic sulfonic acid.

Also, for further improving the sensitivity, there can be used a cyclic acid anhydride, a phenol or an organic acid. Examples of cyclic acid anhydride include phthalic anhydride, tetrahydrophthalic anhydride, hexahydrophthalic anhydride, 3,6-endoxy-Δ4-tetrahydro-phthalic anhydride, tetrachlorophthalic anhydride, maleic anhydride, chloromaleic anhydride, α-phenylmaleic anhydride, succinic anhydride, and pyromeritic anhydride described in U.S. Pat. No. 4,115,128. Examples of phenol include bisphenol-A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane. Also examples of organic acid include sulfonic acids, sulfinic acids, alkylsulfuric acids, phosphonic acids, phosphoric acid esters and carbonxylic acids described for example in JP-A Nos. 60-88942 and 2-96755, and specific examples include p-toluene sulfonic acid, dodecylbenzene sulfonic acid, p-toluene sulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid. A proportion of the cyclic acid anhydrides, phenols and organic acids, on the basis of the mass of the printing plate material is preferably 0.05 to 20 wt. %, more preferably 0.1 to 15 wt. % and most preferably 0.1 to 10 wt. %.

In an image recording layer coating solution of the invention, for widening the processing stability to developing conditions, there may be added a nonionic surfactant as described in JP-A Nos. 62-251740 and 3-208514, an amphoteric surfactant as described in JP-A Nos. 59-121044 and 4-13149, a siloxane compound as described in European Patent No. 950517, or a copolymer of a fluorine-containing monomer as described in JP-A No. 11-288093.

Specific examples of the nonionic surfactant include sorbitan tristearate, sorbitan monopalmitate, sorbitan trioleate, stearic acid monoglyceride, and polyoxyethylene nonyl phenyl ether. Specific examples of the amphoteric surfactant include alkyldi(aminoethyl)glycin, alkylpolyaminoethylglycin hydrochlorate, 2-alkyl-N-carboxyethyl-N-hydroxyethylimidazolinium betain and N-tetradecyl-N,N-betain (for example "Amogen K" (trade name), manufactured by Dai-ichi Kogyo Seiyaku Co., Ltd.).

As the siloxane compound, there is preferred a block copolymer of dimethylsiloxane and polyalkylene oxide, and specific examples include polyalkylene oxide-modified silicone such as DBE-224, DBE-621, DBE-712, DBP-732, and DBP-534 manufactured by Chisso Co., Ltd., and Tego Glide 100 manufactured by Tego Inc., Germany.

A proportion of the nonionic surfactant or the amphoteric surfactant, on the basis of the mass of the photosensitive composition, is preferably 0.05 to 15 wt. %, and more preferably 0.1 to 5 wt. %.

In the photosensitive composition of the invention, there may be added a printout agent for obtaining a visible image immediately after heating by irradiation, or a dye or a pigment as an image coloring agent.

The printout agent can be represented by a combination of a compound releasing an acid upon heating by irradiation (photo-acid releasing agent), and an organic dye capable of forming a salt. Specific examples include a combination of o-naphthoquinone diazide-4-sulfonic acid halogenide and a salt-forming organic dye as described in JP-A Nos. 50-36209 and 53-8128, and a combination of a trihalomethyl compound and a salt-forming organic dye as described in JP-A Nos. 53-36223, 54-74728, 60-3626, 61-143748, 61-151644 and 63-58440. Such trihalomethyl compound can be an oxazole compound or a triazine compound, both being excellent in stability with passage of time and providing a clear printout image.

As a coloring agent for the image, there may be employed another dye in addition to the aforementioned salt-forming organic dye. Advantageous examples of the dye include the salt-forming organic dyes, oil-soluble dyes, and basic dyes. Specific examples include oil yellow #101, oil yellow #103, oil pink #312, oil green BG, oil blue BOS, oil blue #603, oil black BY, oil black BS, oil black T-505 (foregoing manufactured by Orient Kagaku Kogyo Co., Ltd.), Victoria pure blue, crystal violet (CI42555), methyl violet (CI42535), ethyl violet, rhodamine B (CI145170B), marachite green (CI42000), and methylene blue (CI52015). Also particularly preferred are dyes described in JP-A No. 62-293247. These dyes may be added to the photosensitive composition in a proportion of 0.01 to 10 wt. %, preferably 0.1 to 3 wt. % with respect to the mass of the total solids of the photosensitive composition. Also in the photosensitive composition of the invention, a plasticizer is added if necessary in order to provide a flexibility in a coated film. For example there can be employed butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer or a polymer of acrylic acid or methacrylic acid.

In addition there may be suitably added, according to the purpose, an epoxy compound, a vinyl ether, a phenolic compound having a hydroxymethyl group described in JP-A No. 8-276558, a phenolic compound having an alkoxymethyl group, and a crosslinking compound performing an inhibition of dissolution in alkali, proposed by the present inventors in JP-A No. 11-160860.

The photosensitive composition of the invention, thus obtained, is excellent in a film forming property, a film strength and shows a high alkali solubility in an exposed area to the IR light, and is advantageously employed as an image recording layer of a positive-type planographic printing plate precursor suitable for exposure by an irradiation of IR.

Application to Planographic Printing Plate Precursor

An image recording layer of a planographic printing plate precursor, in which the photosensitive composition of the invention is applied, can be produced by dissolving the photosensitive composition in a solvent and coating it on a suitable substrate. Also a protective layer, a resin intermediate layer, a backcoat layer etc. to be explained later can be formed in a similar manner.

Examples of the solvent to be used include ethylene dichloride, cyclohexanone, methyl ethyl ketone, methanol, ethanol, propanol, ethyleneglycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl-urea, N-methylpyrrolidone, dimethyl sulfoxide, sulfolane, γ-butyrolactone, and toluene, but these examples are not restrictive. These solvents may be used singly or in a mixture thereof.

A concentration of the aforementioned components (all solids including the additives) in the solvent is preferably 1 to 50 wt. %.

Also a coating amount (solid) on the substrate after coating and drying varies depending on the purpose of use, but, for a photosensitive printing plate, there is generally preferred a range of 0.5 to 5.0 g/m$^2$. With a decrease in the coating amount, the apparent sensitivity increases but film characteristics of the photosensitive film become worse.

The coating can be achieved by various methods, such as bar coater coating, spin coating, spray coating, curtain coating, dip coating, air knife coating, blade coating or roller coating.

In the image recording layer formed by the photosensitive composition of the invention, there may be added a surfactant for improving the coating property, for example a fluorine type surfactant as described in JP-A No.62-170950. An amount of addition with respect to the mass of the total solids of the image recording layer is preferably 0.01 to 1 wt. %, more preferably 0.05 to 0.5 wt. %.

Resin Intermediate Layer

In the planographic printing plate precursor of the invention, a resin intermediate layer may be provided if necessary between the substrate and the image recording layer.

Such resin intermediate layer, constituted by a polymer substance between the substrate and the image recording layer, functions as a heat insulating layer and provides an advantage of achieving a higher sensitivity since heat generated by an irradiation with an IR laser can be efficiently utilized without being diffused into the substrate. The image recording layer of the invention, positioned at a surface to be exposed or in the vicinity thereof even in the presence of the resin intermediate layer, can maintain a satisfactory sensitivity to the IR laser.

In an unexposed area, it is considered that the image recording layer itself, which is non-permeable to the alkaline developer, serves as a protective layer to the resin intermediate layer, thereby providing a satisfactory developing stability and an image with an excellent discrimination, and securing a stability with passage of time. On the other hand, in an exposed area, it is considered that components of the image recording layer, which no longer inhibit dissolution, are promptly dissolved or dispersed in the developer and the resin intermediate layer, positioned adjacent to the substrate and constituted with an alkali-soluble polymer, shows a satisfactory solubility in the developer and is promptly dissolved without generating a residual film etc. even in a developer of a lowered activity, to improve the developing property. Thus, the resin intermediate layer is considered useful.

Substrate

A substrate to be employed in the planographic printing plate precursor of the invention is not particularly limited as long as it is a dimensionally stable plate-shaped member having required strength and flexibility, and can be, for example, paper, paper laminated with a plastic material (for example, of polyethylene, polypropylene or polystyrene), a metal plate (for example aluminum, zinc or copper), a plastic film (for example cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinylacetal), or paper or a plastic film laminated or evaporated with the aforementioned metal.

A preferred substrate is a polyester film or an aluminum plate, and an aluminum plate is particularly preferred as it has a satisfactory dimensional stability and is relatively inexpensive. A preferred aluminum plate is a pure aluminum plate or an alloy plate principally composed of aluminum and containing another element in a small amount, and can also be a plastic film on which aluminum is evaporated or laminated. The another element contained in the aluminum alloy may be silicon, iron, manganese, copper, magnesium, chromium, zinc, bismuth, nickel and titanium. The content of another element in the alloy is no more than 10 mass %. There is particularly preferred pure aluminum, but there may be used aluminum containing another element in a small amount since completely pure aluminum is difficult to produce in the refining technology.

As described above, the aluminum plate employable according to the invention is not specific in the composition thereof but there can be suitably utilized an aluminum plate of an already known and utilized material. A thickness of the aluminum plate to be employed in the invention is preferably about 0.1 to 0.6 mm, more preferably 0.15 to 0.4 mm, and particularly preferably 0.2 to 0.3 mm.

Prior to the surface roughening of the aluminum plate, there is conducted, if desired, a degreasing process for example with a surfactant, an organic solvent or an aqueous alkali solution, in order to remove rolling oil on the surface.

The roughening process of the surface of the aluminum plate can be executed by various methods, for example a mechanical roughening method, a method of surface roughening by electrochemically dissolving the surface, or a method of selectively dissolving the surface chemically. For the mechanical method, there can be employed a known method such as a ball polishing method, a brush polishing method, a blast polishing method and a buff polishing method. Also as the electrochemical roughening method, there is known a method utilizing an AC current or a DC current in an electrolyte solution of hydrochloric acid or nitric acid. It is also possible to utilize a method of combining the two, as disclosed in JP-A NO. 54-63902. Thus-surface roughened aluminum plate is subjected, after alkali etched and neutralized if necessary, to an anodizing process, if desired, for improving a water-holding property and an abrasion resistance of the surface. For anodizing the aluminum plate, there can be employed various electrolytes that can form a porous oxide film, and there is generally utilized sulfuric acid, phosphoric acid, oxalic acid, chromic acid or a mixed acid thereof. A concentration of the electrolyte is suitable determined according to the kind of the electrolyte.

Conditions of the anodizing process are variable depending on the electrolyte to be used and cannot be specific uniquely. Generally, a condition in which a concentration of the electrolyte in solution is 1 to 80 wt %, a solution temperature is 5 to 70° C., a current density is 5 to 60 A/dm$^2$, a voltage is 1 to 100 V, and an electrolysis time is 10 seconds to 5 minutes, is appropriate. In a case the amount of an anodized oxide film is less than 1.0 g/m$^2$, the printing durability becomes insufficient and scars tend to arise in a non-image area of the planographic printing plate, leading to so-called "scar smear" which is caused by ink deposition on such scars at the printing operation. After the anodizing process, the aluminum is subjected to a process of rendering the surface thereof hydrophilic, according to the necessity. The treatment for rendering the surface hydrophilic, employable according to the invention can be an alkali metal silicate method (for example utilizing an aqueous solution of sodium silicate) as disclosed in U.S. Pat. Nos. 2,714,066, 3,181,461, 3,280,734 and 3,902,734. In such method, the substrate is immersed or electrolytically treated in an aqueous solution of sodium silicate. There can also be employed a method of utilizing potassium fluorozirconate as disclosed in JP-B No. 36-22063 or a method of treating with polyvinylphosphonic acid as disclosed in U.S. Pat. Nos. 3,276,868, 4,153,461 and 4,689,272.

The planographic printing plate precursor of the invention is obtained by forming a positive-type image recording layer on a substrate, but an undercoat layer may be provided therebetween, if necessary.

As a component for the undercoat layer there may be employed various organic compounds, of which examples include carboxymethyl cellulose, dextrin, gum Arabic, an organophosphonic acid for example a phosphonic acid having an amino group such as 2-aminoethylphosphonic acid, phenylphosphonic acid that may have a substituent, naphthylphosphonic acid, an alkylphosphonic acid, glycerophosphonic acid, methylenediphosphonic acid or ethylenediphosphonic acid, an organic phosphoric acid such as phenylphosphoric acid that may have a substituent, naphthylphosphoric acid, an alkylphosphoric acid or glycerophosphoric acid, an organic phosphinic acid such as phenylphosphinic acid that may have a substituent, naphthylphosphinic acid, an alkylphosphinic acid or glycerophosphinic acid, an amino acid such as glycine or β-alanine, and an amine hydrochlorate having a hydroxyl group such as triethanolamine hydrochlorate, and there may also be employed a mixture of two or more kinds.

Such organic undercoat layer can be formed by following methods. An employable method is a method of coating and drying, on an aluminum plate, a solution of the aforementioned organic compound dissolved in water or an organic solvent such as methanol, ethanol or methyl ethyl ketone, or a mixture thereof. Another method is a method of immersing an aluminum plate in a solution of the aforementioned organic compound dissolved in water or an organic solvent such as methanol, ethanol or methyl ethyl ketone, or a mixture thereof, thereby causing the compound to be adsorbed, and then rinsing the aluminum plate with water or the like followed by drying to obtain the organic undercoat layer. In the former method, a solution containing the aforementioned organic compound in a concentration of 0.005 to 10 mass % can be coated in various methods. Also the latter method is executed with a solution concentration of 0.01 to 20 mass %, preferably 0.05 to 5 mass %, an immersing temperature of 20 to 90° C., preferably 25 to 50° C., and an immersing time of 0.1 seconds to 20 minutes, preferably 2 seconds to 1 minute. The solution to be used can be adjusted to a pH value of 1 to 12 by a basic substance such as ammonia, triethylamine or potassium hydroxide, and an acidic substance such as hydrochloric acid or phosphoric acid. There may also be added a yellow dye for the purpose of improving a reproduction of gradation of the image recording material.

A coating amount of the organic undercoat layer is usually 2 to 200 mg/m$^2$, preferably 5 to 100 mg/m$^2$. A coating amount less than 2 mg/m$^2$ cannot provide a sufficient printing durability, and a coating amount in excess of 200 mg/m$^2$ leads to a similar result.

The positive-type planographic printing plate precursor thus prepared is usually subjected to an image exposure and a development process.

As a light source for the light for image exposure, there is preferred a light source having a light emission in near IR to IR wavelength region, and a solid-state laser or a semiconductor laser is particularly preferred.

As a developer and a replenisher for the planographic printing plate precursor utilizing the photosensitive composition of the invention, there can be used an alkaline aqueous solution already known in the art.

For example, there can be employed an inorganic alkali salt such as sodium silicate, potassium silicate, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide. Also there can be used an organic alkali compound such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, minoisopropanolamine, diisopropanolamine, ethylenimine, ethylenediamine or pyridine. Such alkali compounds may be used singly or in a combination of two or more kinds thereof.

A particularly preferred developer among these alkali compounds is an aqueous silicate solution such as of sodium silicate or potassium silicate. It is because the developability can be regulated by the ratio and concentration of silicon oxide $SiO_2$ and an alkali metal oxide $M_2O$ constituting the silicate salt, and alkali metal silicate salts as described in JP-A No. 54-62004 and JP-B No. 57-7427 can be effectively used.

Further, in a case of a development with an automatic developing apparatus, it is already known that many PS plates can be developed without replacing the developer in a developing tank over a long period, by adding, to the developer, an aqueous solution (replenisher) with an alkali-intensity higher than that in the developer. Such replenishing method can be advantageously employed also in the invention. In the developer solution and the replenisher, various surfactants and organic solvents may be added according to the necessity, for the purpose of increasing or suppressing the developability, dispersing development dregs and improving an ink affinity of an image area of the printing plate.

A preferred surfactant can be an anionic, cationic, nonionic or amphoteric surfactant. Also if necessary, there may be added, to the developer solution and the replenisher, a reducing agent such as hydroquinone, resorcin, a sodium salt or a potassium salt of an inorganic acid such as sulfurous acid or hydrogensulfurous acid, an organic carboxylic acid, a defoamer or a water softener.

The printing plate developed with the aforementioned developer solution and the replenisher is post-processed with rinsing water, a rinse solution containing for example a surfactant, or a desensitizing solution including gum Arabic or a starch derivative. When using the photosensitive composition of the invention as the planographic printing plate, these processes may be employed in various combinations as the post-processing.

In recent printing plate making and printing industries, an automatic processor for the printing plate is widely used for rationalizing and standardizing the printing plate making operation. Such automatic processor is generally composed of a development unit and a post-process unit. The automatic processor is provided with an apparatus for conveying a printing plate, tanks for various liquids and a spraying apparatus. In the automatic processor, an exposed printing plate is subjected, while conveyed horizontally, to a development process by spraying from spray nozzles various process solutions supplied by pumps, to the printing plate. Recently there is also known a method of processing by conveying a printing plate, for example by in-liquid guide rollers, being immersed in a processing solution filled in a processing tank. In such automatic processing, the processing can be executed under a replenishment of a replenisher to each processing solution according to the processed amount or the working time. Also there may be employed so-called disposable processing method in which the processing is executed with a practically unused processing solution.

In the planographic printing plate precursor of the invention, in a case a planographic printing plate obtained by an image exposure, a development, a washing and/or rinsing and/or gumming has an unnecessary image portion (for example a trace of an edge of an original film), such unnecessary image portion is erased. Such erasure is executed preferably according to a method of coating an erasing liquid on the unnecessary image portion and executing a rinsing with water after standing for a predetermined time, as described in JP-B No. 2-13293. Another method of irradiating the unnecessary image portion with an active light guided by an optical fiber and then executing development, as described in JP-A No. 59-174842 can be also employed.

The planographic printing plate thus obtained may be subjected to a printing process after coating, if desired, of a desensitizing gum. Optionally, a baking process is executed for obtaining a planographic printing plate having further improved printing durability.

In a case of baking a planographic printing plate, there is preferably executed, prior to the baking, a process with a surface conditioning solution as described in JP-B Nos. 61-2518 and 55-28062 and JP-A Nos. 62-31859 and 61-159655.

For such process, a method of coating the surface conditioning solution on the planographic printing plate with a sponge or a cotton pad soaking up the surface conditioning solution, or immersing the printing plate in a vat filled with the surface conditioning solution, or coating the surface conditioning solution with an automatic coater, can be employed. Also a more preferable result can be provided by making the coating amount uniform with a squeegee or a squeeze roller after the coating.

The coating amount of the counter-etching solution is generally within a range of 0.03 to 0.8 $g/m^2$ (dry weight). The planographic printing plate coated with the surface conditioning solution is heated, after drying if necessary, to a high temperature by a baking processor (for example baking processor "BP-1300" supplied by Fuji Photo Film Co., Ltd.). The temperature and time of heating in such operation depend on the kind of components constituting the image, but are preferably in ranges of 180 to 300° C. and 1 to 20 minutes.

The planographic printing plate after the baking process may be suitably subjected to conventional processes such as rinsing and gumming, but so-called desensitizing process such as gumming may be dispensed with in a case a surface conditioning solution including a water-soluble polymer compound is used. The planographic printing plate obtained by such processes is used for example in an offset printing press and is used for printing a large number of prints.

EXAMPLES

In the following, the present invention will be clarified in more details by examples thereof, but the scope of the invention is not limited by such examples. In the examples, planographic printing plate precursors employing the photosensitive compositions of the invention as image recording layers are evaluated, and the results of such evaluations were taken as those for the photosensitive compositions of the invention.

Preparation of Substrate

A JIS-A-1050 aluminum plate having a thickness of 0.3 mm was processed in combination processes of the following steps (a) to (j) to obtain substrates A, B, C and D.

(a) Mechanical Surface Roughening Process

A mechanical surface roughening was conducted with a rotating roller-shaped nylon brush, under a supply of a suspension of an abrasive (silica sand) of a specific gravity of 1.12 and water as an abrading slurry onto the surface of the aluminum plate. The abrasive had an average particle size of 8 μm and a maximum particle size of 50 μm. The nylon brush is constituted of fibers of nylon 6–10, with a length of 50 mm and a diameter of 0.3 mm. The nylon brush was formed by planting the fibers densely on holes formed on a stainless steel cylinder of a diameter of 300 mm. There were employed three rotating brushes, and two supporting rollers (diameter 200 mm) positioned under the brushes with a mutual distance of 300 mm. The brush roller was pressed to the aluminum plate in such a manner that a load on a driving motor for rotating the brush increased by 7 kW in comparison with a state prior to such pressing. The brushes had a rotating direction same as a moving direction of the aluminum plate. The brushes rotated at rotating rate of 200 rpm.

(b) Alkali Etching Process

The aluminum plate obtained in the foregoing step was subjected to an etching process by spraying an NaOH aqueous solution (concentration 26 mass %, aluminum ion concentration 6.5 mass %) having a temperature of 70° C., thereby dissolving aluminum by 6 g/m². Then a spray rinsing was conducted with well water.

(c) Desmutting Process

A desmutting process was conducted by spraying a 1 mass % aqueous solution of nitric acid (containing aluminum ions by 0.5 mass %) having a temperature of 30° C., followed by a rinsing by spraying water. The aqueous solution of nitric acid employed in the desmutting process was an exhaust solution of an electrochemical surface roughening process with an AC current in an aqueous solution of nitric acid.

(d) Electrochemical Surface Roughening Process

An electrochemical surface roughening process was executed in continuous manner with an AC voltage of 60 Hz. An electrolyte employed in this process was a 10.5 g/L aqueous solution of nitric acid (containing aluminum ions of 5 g/L) having a temperature of 50° C. The electrochemical surface roughening process was executed with a trapezoidal rectangular AC current with a time TP of 0.8 msec, which is a time between zero current and peak current, and a DUTY ratio of 1:1, utilizing a carbon counter electrode. Ferrite was used as an auxiliary anode. An electrolytic tank used was of radial cell type.

A current density was 30 A/dm² at a peak value of the current, and a quantity of electricity was 220 C/dm² in total when the aluminum plate constituted the anode. In the auxiliary anode, 5% of the current from the power supply were given.

Thereafter, a spray rinsing was conducted with well water.

(e) Alkali Etching Process

The aluminum plate was subjected to an etching process by spraying a solution, having a sodium hydroxide concentration of 26 mass % and an aluminum ion concentration of 6.5 mass %, having a temperature of 32° C., thereby dissolving aluminum by 0.20 g/m², thus eliminating a smut component principally constituted by aluminum hydroxide, generated at the preceding AC electrochemical surface roughening process, and dissolving and smoothing edge portions of generated pits. Then a spray rinsing was conducted with well water.

(f) Desmutting Process

A desmutting process was conducted by spraying a 15 mass % aqueous solution of nitric acid (containing aluminum ions by 4.5 mass %) having a temperature of 30° C., followed by a spray rinsing with well water. The aqueous solution of nitric acid employed in the desmutting process was an exhaust solution of an electrochemical surface roughening process with an AC current in an aqueous solution of nitric acid.

(g) Electrochemical Surface Roughening Process

An electrochemical surface roughening process was executed in continuous manner with an AC voltage of 60 Hz. An electrolyte employed in this process was a 7.5 g/L aqueous solution of hydrochloric acid (containing aluminum ions of 5 g/L) having a temperature of 35° C. The electrochemical surface roughening process was executed with a rectangular AC current, utilizing a carbon counter electrode. Ferrite was used as an auxiliary anode. An electrolytic tank used was of radial cell type.

A current density was 25 A/dm² at a peak value of the current, and a quantity of electricity was 50 C/dm² in total when the aluminum plate constituted the anode.

Thereafter, a spray rinsing was conducted with well water.

(h) Alkali Etching Process

The aluminum plate was subjected to an etching process by spraying a solution, having a sodium hydroxide concentration of 26 mass % and an aluminum ion concentration of 6.5 mass %, at a temperature of 32° C., thereby dissolving aluminum by 0.10 g/m², thus eliminating a smut component principally constituted by aluminum hydroxide, generated at the preceding AC electrochemical surface roughening process, and dissolving and smoothing edge portions of generated pits. Then a spray rinsing was conducted with well water.

(i) Desmutting Process

A desmutting process was conducted by spraying a 25 mass % aqueous solution of sulfuric acid (containing aluminum ions by 0.5 mass %) of a temperature of 60° C., followed by a spray rinsing with well water.

(j) Anodizing Process

Sulfuric acid was used as an electrolyte. The electrolyte had a sulfuric acid concentration of 170 g/L (containing 0.5 mass % of aluminum ions) and a temperature of 43° C. Then a spray rinsing was conducted with well water.

A current density was about 30 A/dm². A final oxide film amount was 2.7 g/m².

<Substrate A>

A substrate A was prepared by executing the steps (a) to (j) in succession, and regulating an etching amount in the step (e) at 3.5 g/m².

<Substrate B>

A substrate B was prepared by executing the aforementioned steps in succession, excluding the steps (g), (h) and (i).

<Substrate C>

A substrate C was prepared by executing the aforementioned steps in succession, excluding the steps (a), (g), (h) and (i).

<Substrate D>

A substrate D was prepared by executing the aforementioned steps in succession, excluding the steps (a), (d), (e) and (i), and regulating the total quantity of electricity in the step (g) at 450 C/dm².

Thus obtained substrates A, B, C and D were subjected in succession to a process for rendering hydrophilicity and an undercoating process shown in the following.

(k) Alkali Metal Silicate Process

Each of thus obtained aluminum substrates A, B, C and D was subjected to an alkali metal silicate process (silicate process) by immersing, for 10 seconds, in a processing bath of a 1 mass % aqueous solution of sodium silicate No. 3 of 30° C. Then spray rinsing was conducted with well water. In this operation, a deposition amount of silicate was 3.5 mg/m².

Undercoating Process

Each aluminum substrate thus obtained after the alkali metal silicate process was coated with an undercoating solution of the following composition and was dried for 15 seconds at 80° C. A coating amount after drying was 14 mg/m².

| <Composition of undercoating solution> | |
|---|---|
| following polymer compound | 0.3 g |
| methanol | 100 g |
| water | 1 g |

Polymer Compound

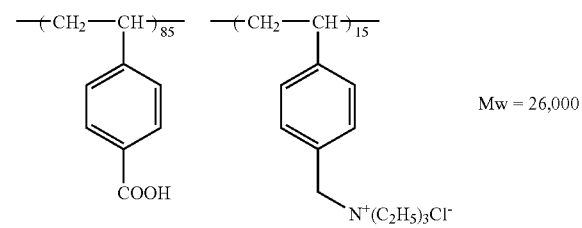

Examples 1 to 12

Comparative Examples 1 to 3

The obtained substrates A to D were coated with the following image recording layer coating solution (photosensitive composition) and were dried for 1 minute in an oven at 150° C. to obtain positive-type planographic printing plate precursors having a dry coating amount of 1.7 g/m².

| <Image recording layer coating solution> | |
|---|---|
| m,p-cresol novolac (m/p ratio = 6/4, weight-average molecular weight 7,300, containing 0.4 mass % of unreacted cresol) | (amount in Table 1) |
| vinyl polymer in Table 1 | (amount in Table 1) |
| following IR absorber (cyanine dye A) | 0.017 g |
| following IR absorber (cyanine dye B) | 0.023 g |
| 2,4,6-tris(hexyloxy)benzenediazonium-2-hydroxy-4-methoxybenzophenone-5-sulfonate | 0.01 g |
| p-toluenesulfonic acid | 0.003 g |
| cyclohexane-1,2-dicarboxylic anhydride | 0.06 g |
| Victoria pure blue BOH of which counter ion is changed to 1-naphthalene sulfonic acid anion | 0.015 g |
| fluorine type surfactant (Megafac F176; Dai-Nippon Ink and Chemical Industries, Co. Ltd.) | 0.02 g |
| methyl ethyl ketone | 15 g |
| 1-methoxy-2-propanol | 7 g |

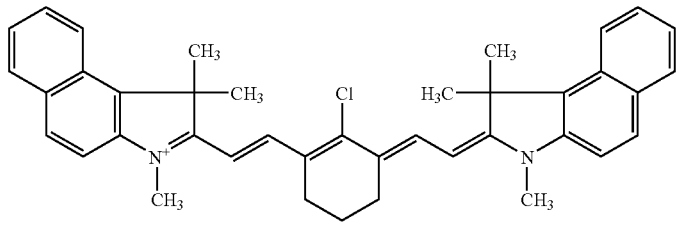

Cyanine Dye (A)

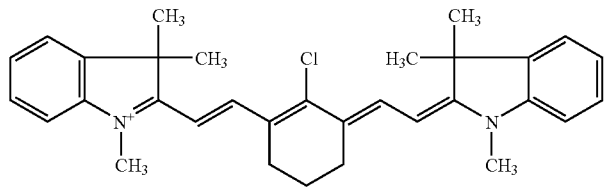

-continued

Cyanine Dye (B)

A vinyl polymer [AP-C1] employed in the comparative example 2 and a vinyl polymer [AP-C2] employed in the comparative example 3 are shown in the following, wherein (1) indicates a carboxyl group content (meq/g) and (2) indicates a solubility parameter (MPA$^{1/2}$) of polymer.

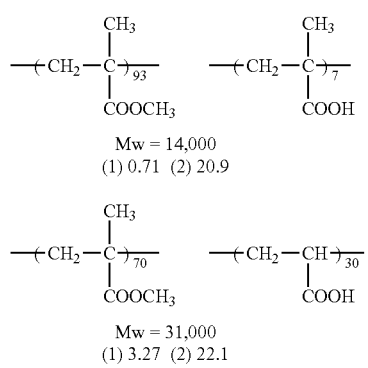

Evaluation of Developing Latitude

A test pattern was written on the obtained planographic printing plate precursor by Creo Trendsetter with a beam intensity of 9 W and a drum rotation rate of 150 rpm.

Thereafter it was developed with a PS processor 900H (manufactured by Fuji Photo Film Co., Ltd.) charged with the following developer A or B, of which dilution ratio and electric conductivity was made variable by changing an amount of water, with a liquid temperature kept at 30° C. and a developing time of 22 seconds. A difference of a highest electric conductivity and a lowest electric conductivity of the developer, among the developers which performed satisfactory development without dissolution of an image area and without a smear or a coloring resulting from a residual film of the insufficiently developed photosensitive layer, was evaluated as a developing latitude. The obtained results are shown in Table 1.

| <Composition of developer A> | |
|---|---|
| SiO$_2$.K$_2$O (K$_2$O/SiO$_2$ = 1/1 (molar ratio)) | 4.0 mass % |
| citric acid | 0.5 mass % |
| polyethylene glycol lauryl ether (weight-averaged molecular weight = 1000) | 0.5 mass % |
| water | 95.0 mass % |
| <Composition of developer B> | |
| D-sorbit | 2.5 mass % |
| sodium hydroxide | 0.85 mass % |
| polyethylene glycol lauryl ether (weight-averaged molecular weight = 1000) | 0.5 mass % |
| water | 96.15 mass % |

Evaluation of Printing Durability

A test pattern was written on the obtained planographic printing plate precursor by Creo Trendsetter with a beam intensity of 9 W and a drum rotation rate of 150 rpm.

Then, a planographic printing plate obtained, in a process same as that employed in the foregoing evaluation of the developing latitude, developed with a developer having an electric conductivity within a specific range which developer performed satisfactory development without dissolution of an image area and without a smear or a coloring resulting from a residual film of the insufficiently developed photosensitive layer, was used in a printing operation on a printing press Lithrone (manufactured by Komori Corporation), utilizing a black ink DIC-GEOS (manufactured by Dai-Nippon Ink and Chemical Industries Co., Ltd.), and a printing durability was evaluated by a number of prints which had been printed when the start of lowering of the density of a solid image was visually recognized. The obtained results are shown in Table 1.

Evaluation of Printing Durability After Baking Process

After a surface of a planographic printing plate obtained by an exposure and a development conducted in a similar manner to those in the foregoing evaluation of printing durability was wiped with a baking surface conditioning solution BC-3 manufactured by Fuji Photo Film Co., Ltd., and was subjected to a baking process for 7 minutes at about 250° C. Then the plate was rinsed with water and was treated with a solution obtained by diluting a gum GU-7, manufactured by Fuji Photo Film Co., Ltd., with water to a twice volume.

Then, the planographic printing plate was used in a printing operation, in the same manner as in the foregoing evaluation of the printing durability, by a printing press Lithrone (manufactured by Komori Corporation), utilizing a black ink DIC-GEOS (manufactured by Dai-Nippon Ink and Chemical Industries Co., Ltd.), and a printing durability after baking process was evaluated by a number of prints that had been printed when the start of lowering of the density of a solid image was visually recognized. The obtained results are shown in Table 1.

TABLE 1

| | | Amount of cresol novolac (g) | Vinyl polymer | | Carboxyl group content (meq/g) | Solubility parameter (MPa$^{1/2}$) | Developing latitude (mS/cm) | | Printing durability (×10$^4$ prints) | |
|---|---|---|---|---|---|---|---|---|---|---|
| | Substrate | | Compound No. | Amount (g) | | | Developer A | Developer B | Without baking | With baking |
| Ex. 1 | A | 0.93 | AP-1 | 0.07 | 2.23 | 20.9 | 5 | 6 | 8 | 20 |
| Ex. 2 | B | 0.92 | AP-2 | 0.08 | 2.22 | 20.4 | 6 | 6 | 8 | 20 |
| Ex. 3 | B | 0.92 | AP-3 | 0.08 | 2.22 | 20.6 | 7 | 7 | 9 | 21 |
| Ex. 4 | C | 0.92 | AP-3 | 0.08 | 2.22 | 20.6 | 6 | 7 | 8 | 19 |
| Ex. 5 | D | 0.94 | AP-3 | 0.06 | 2.22 | 20.6 | 6 | 7 | 8 | 20 |
| Ex. 6 | C | 0.92 | AP-2 | 0.08 | 2.22 | 20.4 | 6 | 6 | 8 | 20 |
| Ex. 7 | B | 0.95 | AP-5 | 0.05 | 2.48 | 20.6 | 6 | 7 | 9 | 23 |
| Ex. 8 | B | 0.90 | AP-7 | 0.10 | 2.49 | 21.2 | 6 | 7 | 9 | 18 |
| Ex. 9 | B | 0.91 | AP-8 | 0.09 | 2.91 | 20.8 | 7 | 7 | 8 | 21 |
| Ex. 10 | B | 0.93 | AP-10 | 0.07 | 2.49 | 20.9 | 5 | 6 | 8 | 20 |
| Ex. 11 | B | 0.96 | AP-12 | 0.04 | 2.19 | 21.2 | 7 | 7 | 9 | 22 |
| Ex. 12 | B | 0.94 | AP-13 | 0.06 | 2.03 | 20.5 | 6 | 6 | 8 | 21 |
| Comp.Ex. 1 | B | 1.00 | — | — | — | — | 1 | 2 | 7 | 17 |
| Comp.Ex. 2 | B | 0.93 | AP-C1 | 0.07 | 0.71 | 20.9 | 1 | 1 | 6 | 14 |
| comp.Ex. 3 | B | 0.93 | AP-C2 | 0.07 | 3.27 | 22.1 | 1 | 2 | 6 | 15 |

Results shown in Table 1 confirm that all the planographic printing plate precursors comprising the photosensitive composition, containing the vinyl polymer of the invention, in the image recording layer are excellent in the developing latitude and the printing durability. And it is considered that the photosensitive composition of the invention is excellent in the film forming property and the film strength, and shows an excellent alkali solubility when exposed to an IR light. Also a significant improvement in the printing durability was observed by the baking process conducted after the development.

On the other hand, the planographic printing plate precursors of the comparative examples not comprising the specific vinyl polymer of the invention as a component of the image recording layer were inferior both in the developing latitude and the printing durability. And the photosensitive composition in the comparative examples was considered incapable of providing sufficient film forming property, film strength and alkali solubility after exposure by an irradiation with IR.

Examples 13 to 15

The obtained substrate B was coated with the aforementioned undercoating solution as in the examples 1 to 12, then further coated with a lower layer coating solution of the following composition utilizing a wire bar with a wet coating amount of 28 ml/m² to obtain a coating amount of 1.5 g/m², and dried for 60 seconds in a drying oven at 150° C.

The obtained substrate having the lower layer was coated with an image recording layer (upper layer) coating solution of the following composition utilizing a wire bar with a wet coating amount of 11 ml/m² to obtain a coating amount of 1.8 g/m², and dried for 70 seconds in a drying oven at 140° C. to obtain a positive-type planographic printing plate precursor.

<Lower layer coating solution>

| | |
|---|---|
| N-(p-aminosulfonylphenyl)methacrylamide/methyl methacrylate/acrylonitrile copolymer (molar ratio 37:33:30, weight-averaged molecular weight 65,000) | 2.133 g |

-continued

<Lower layer coating solution>

| | |
|---|---|
| cyanine dye A (foregoing structure) | 0.098 g |
| 4,4'-bishydroxyphenylsulfone | 0.126 g |
| cyclohexane dicarboxylic anhydride | 0.100 g |
| bis(hydroxymethyl)-p-cresol | 0.090 g |
| p-toluenesulfonic acid | 0.012 g |
| ethyl violet of which counter ion is changed to 6-hydroxynaphthalene sulfonic acid | 0.100 g |
| 3-methoxy-4-diazodiphenylamine hexafluoro-phosphate (heat decomposable compound) | 0.03 g |
| fluorine type surfactant (Megafac F176; Dai-Nippon Ink and Chemical Industries, Co. Ltd.) | 0.035 g |
| methyl ethyl ketone | 26.6 g |
| 1-methoxy-2-propanol | 13.6 g |
| N,N-dimethyl acetamide | 13.8 g |

Image recording layer (upper layer) coating solution

| | |
|---|---|
| polymer compound in Table 2 | (amount in Table 2) |
| cresol novolac resin (PR-54046, Sumitomo Bakelite Co.) | (amount in Table 2) |
| cyanine dye C (following structure) | 0.008 g |
| tetrabutylammonium bromide | 0.030 g |
| fluorine type surfactant (Megafac F176; Dai-Nippon Ink and Chemical Industries, Co. Ltd.) | 0.035 g |
| 1-methoxy-2-propanol | 40.2 g |

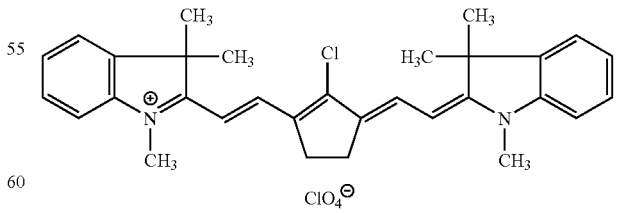

Cyanine Dye C

Evaluation of Developing Latitude and Printing Durability

A developing latitude and a printing durability of the obtained planographic printing plate precursors were evaluated after executing exposure and development in the same manner as in the examples 1 to 12. Results are shown in Table 2.

TABLE 2

| | Amount of cresol novolac (g) | Polymer compound | | Developing latitude (mS/cm) | | Printing durability without baking (×10⁴ prints) |
| --- | --- | --- | --- | --- | --- | --- |
| | | Compound | Amount (g) | Developer A | Developer B | |
| Ex. 13 | 0.32 | AP-3 | 0.03 | 7 | 8 | 11 |
| Ex. 14 | 0.33 | AP-4 | 0.02 | 7 | 7 | 9 |
| Ex. 15 | 0.32 | AP-10 | 0.03 | 8 | 8 | 12 |

Results shown in Table 2 confirm that the planographic printing plate precursors comprising the photosensitive composition of the invention as the image recording layer, even in a case the image recording layer has a multi-layered structure, are excellent in the developing latitude and the printing durability, similar to the effects in case of the single-layered structure and providing a further improvement in the printing durability.

Based on the foregoing examples, it is clarified that the photosensitive composition of the invention is useful as an image recording layer for a positive-type planographic printing plate precursor compatible to the exposure by an irradiation of IR.

Thus, the present invention allows to obtain a photosensitive composition, which is useful as an image recording layer of a positive-type planographic printing plate precursor, and which is excellent in film forming property and film strength. And an exposed portion to the IR light of the image recording layer can quickly dissolve in an alkaline aqueous solution.

What is claimed is:

1. A photosensitive composition comprising:
   (A) a vinyl polymer including a copolymerization component having a carboxyl group, the carboxyl group in a molecule in an amount of 2.0 meq/g or greater, and the vinyl polymer having a solubility parameter less than 21.3 MPa$^{1/2}$;
   (B) a polymer compound having a phenolic hydroxyl group; and
   (C) an IR absorber.

2. A photosensitive composition according to claim 1, wherein the copolymerization component having the carboxyl group comprises a monomer represented by the following general formula (1):

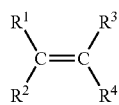

General formula (1)

wherein R$^1$ to R$^4$ each independently represent a hydrogen atom, an alkyl group, or an organic group represented by the following general formula (2), and at least one of R$^1$ to R$^4$ is an organic group represented by the following general formula (2):

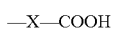

—X—COOH       General formula (2)

wherein X represents a single bond, an alkylene group, an arylene group that may have a substituent, or any one of the following structural formulae (i) to (iii):

wherein Y represents a divalent connecting group, and Ar represents an arylene group that may have a substituent.

3. A photosensitive composition according to claim 1, wherein, in the vinyl polymer, a content of said copolymerization component including the carboxyl group is 2.2 meq/g or higher, meq/g representing a unit of millimolar equivalent of the carboxyl group per 1 g of the vinyl polymer.

4. A photosensitive composition according to claim 1, wherein the vinyl polymer comprises, as a copolymer component, an alkyl acrylate or an alkyl methacrylate both of which have a non-substituted alkyl group having 2 to 4 carbon atoms.

5. A photosensitive composition according to claim 1, wherein the vinyl polymer comprises, as a copolymer component, at least two selected from alkyl acrylates and alkyl methacrylates.

6. A photosensitive composition according to claim 1, wherein the vinyl polymer has a weight-average molecular weight of 15,000 to 200,000.

7. A photosensitive composition according to claim 1, wherein the polymer compound having the phenolic hydroxyl group is insoluble in water and alkali-soluble.

8. A photosensitive composition according to claim 1, wherein the vinyl polymer comprises, as a copolymer component, one of an alkyl acrylate and an alkyl methacrylate both of which have a linear alkyl group, and one of an alkyl acrylate and an alkyl methacrylate both of which have a branched alkyl group.

9. A photosensitive composition according to claim 1, further comprising a decomposable dissolution inhibitor.

10. A photosensitive composition according to claim 9, wherein the decomposable dissolution inhibitor is a diazonium salt compound.

11. A positive-type planographic printing plate precursor comprising an image recording layer produced by dissolving a photosensitive composition in a solvent to prepare a coating solution and coating the coating solution on a suitable substrate, the photosensitive composition including:

(A) a vinyl polymer containing a copolymerization component having a carboxyl group, the carboxyl group being contained in a molecule in an amount of 2.0 meq/g or greater, and the vinyl polymer having a solubility parameter less than 21.3 MPa$^{1/2}$;
(B) a polymer compound having a phenolic hydroxyl group; and
(C) an IR absorber.

12. A positive-type planographic printing plate precursor according to claim 11, wherein a concentration of total solids in the coating solution is 1 to 50 mass %.

13. A positive-type planographic printing plate precursor according to claim 11, wherein a content of the vinyl polymer in the image recording layer is 0.5 to 30 mass % based on total solids in the image recording layer.

14. A positive-type planographic printing plate precursor according to claim 11, which is exposed by a solid state laser or a semiconductor laser.

15. A positive-type planographic printing plate precursor according to claim 11, wherein a coating amount of the coating solution for producing the image recording layer is 0.5 to 5.0 g/m$^2$.

16. A positive-type planographic printing plate precursor according to claim 11, wherein the copolymerization component having the carboxyl group includes a monomer represented by the following general formula (1):

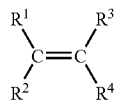

General formula (1)

wherein $R^1$ to $R^4$ each independently represent a hydrogen atom, an alkyl group, or an organic group represented by the following general formula (2), and at least one of $R^1$ to $R^4$ is an organic group represented by the following general formula (2):

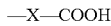

—X—COOH    General formula (2)

wherein X represents a single bond, an alkylene group, an arylene group that may have a substituent, or any one of the following structural formulae (i) to (iii):

wherein Y represents a divalent connecting group, and Ar represents an arylene group that may have a substituent.

17. A positive-type planographic printing plate precursor according to claim 11, wherein, in the vinyl polymer, a content of the copolymerization component having the carboxyl group is 2.2 meq/g or higher, meq/g representing a unit of millimolar equivalent of the carboxyl group per 1 g of the vinyl polymer.

18. A positive-type planographic printing plate precursor according to claim 11, wherein the vinyl polymer comprises, as a copolymer component, at least two selected from alkyl acrylates and alkyl methacrylates.

19. A positive-type planographic printing plate precursor according to claim 11, wherein the vinyl polymer comprises, as a copolymer component, one of an alkyl acrylate and an alkyl methacrylate both of which have a linear alkyl group, and one of an alkyl acrylate and an allyl methacrylate both of which have a branched alkyl group.

20. A positive-type planographic printing plate precursor according to claim 11, wherein the vinyl polymer has a weight-average molecular weight of 15,000 to 200,000.

* * * * *